US008117028B2

(12) United States Patent
Murashima

(10) Patent No.: US 8,117,028 B2
(45) **Date of Patent: *Feb. 14, 2012**

(54) METHOD AND DEVICE FOR CODE CONVERSION BETWEEN AUDIO ENCODING/DECODING METHODS AND STORAGE MEDIUM THEREOF

(75) Inventor: Atsushi Murashima, Tokyo (JP)

(73) Assignee: NEC Corporation, Tokyo (JP)

( * ) Notice: Subject to any disclaimer, the term of this patent is extended or adjusted under 35 U.S.C. 154(b) by 1346 days.

This patent is subject to a terminal disclaimer.

(21) Appl. No.: 10/515,168

(22) PCT Filed: May 22, 2003

(86) PCT No.: PCT/JP03/06378

§ 371 (c)(1),
(2), (4) Date: Nov. 22, 2004

(87) PCT Pub. No.: WO03/098603

PCT Pub. Date: Nov. 27, 2003

(65) Prior Publication Data

US 2005/0219073 A1 Oct. 6, 2005

(30) Foreign Application Priority Data

May 22, 2002 (JP) ................................ 2002-147485

(51) Int. Cl.
*G10L 19/00* (2006.01)
*G10L 11/00* (2006.01)
*G10L 19/02* (2006.01)
*G10L 19/14* (2006.01)
*G10L 19/12* (2006.01)
*H03M 7/00* (2006.01)

(52) U.S. Cl. ........ 704/219; 704/200; 704/201; 704/203; 704/205; 704/220; 704/223; 704/500; 704/501; 341/50

(58) Field of Classification Search .................. 704/219, 704/220, 223, 500, 501, 203, 200, 205, 201; 341/50
See application file for complete search history.

(56) References Cited

U.S. PATENT DOCUMENTS 5,822,724 A * 10/1998 Nahumi ........................ 704/223
(Continued)

FOREIGN PATENT DOCUMENTS

JP 6-222796 8/1994
(Continued)

OTHER PUBLICATIONS

Sun Wan Yoon et al., "An Efficient Transcoding Algorithm for G.723.1 and G.729A Speech Coders", Proceedings of the Eurospeech 2001 Conference, vol. 4, Sep. 3, 2001, pp. 2499-2502, XP007004900.
(Continued)

*Primary Examiner* — Paras Shah
(74) *Attorney, Agent, or Firm* — Young & Thompson

(57) ABSTRACT

When performing audio communication by using different encoding/decoding methods, a code obtained by encoding audio by a certain method is converted into a code decodable by another method with a high audio quality and a small calculation amount. In a code conversion device for converting a first code string into a second code string, an audio decoding circuit acquires a first linear prediction coefficient and excitation signal information from the first code string and drives the filter having the first linear prediction coefficient by the excitation signal obtained from the excitation signal information, thereby creating a first audio signal. A fixed codebook code generation circuit uses the fixed codebook information and minimizes the distance between the second audio signal generated from the information obtained from the second code string and the first audio signal, thereby obtaining the fixed codebook information in the second code string.

10 Claims, 10 Drawing Sheets

U.S. PATENT DOCUMENTS

| | | | | | |
|---|---|---|---|---|---|
| 5,960,386 | A * | 9/1999 | Janiszewski et al. | 704/207 |
| 5,995,923 | A * | 11/1999 | Mermelstein et al. | 704/219 |
| 6,029,125 | A * | 2/2000 | Hagen et al. | 704/201 |
| 6,408,268 | B1 * | 6/2002 | Tasaki | 704/223 |
| 6,810,381 | B1 * | 10/2004 | Sasaki et al. | 704/500 |
| 6,829,579 | B2 * | 12/2004 | Jabri et al. | 704/221 |
| 7,016,831 | B2 * | 3/2006 | Suzuki et al. | 704/203 |
| 7,050,969 | B2 * | 5/2006 | Raj et al. | 704/219 |
| 7,092,875 | B2 * | 8/2006 | Tsuchinaga et al. | 704/210 |
| 7,206,739 | B2 * | 4/2007 | Lee | 704/208 |
| 7,231,345 | B2 * | 6/2007 | Murashima | 704/219 |
| 7,249,014 | B2 * | 7/2007 | Kannan et al. | 704/219 |
| 7,606,703 | B2 * | 10/2009 | Unno | 704/219 |
| 2001/0016817 | A1 * | 8/2001 | Dejaco | 704/264 |
| 2001/0023395 | A1 * | 9/2001 | Su et al. | 704/220 |
| 2001/0027391 | A1 * | 10/2001 | Yasunaga et al. | 704/223 |
| 2002/0169859 | A1 * | 11/2002 | Serizawa | 709/220 |
| 2003/0195745 | A1 * | 10/2003 | Zinser et al. | 704/219 |
| 2006/0149537 | A1 * | 7/2006 | Shiramizu | 704/219 |

FOREIGN PATENT DOCUMENTS

| | | |
|---|---|---|
| JP | 8-123495 | 5/1996 |
| JP | 8-146997 | 6/1996 |
| JP | 9-321783 | 12/1997 |
| JP | 10-282997 | 10/1998 |
| JP | 2001-134296 | 5/2001 |
| JP | 2002-541499 | 12/2002 |

OTHER PUBLICATIONS

F.-K.Chen et al., "Candidate scheme for fast ACELP search", IEE Proceedings: Vision, Image and Signal Processing, Institution of Electrical Engineers, vol. 149, No. 1, Feb. 21, 2002, pp. 10-16, XP006017907.

Redwan Salami et al., "ITU-T G. 729 Annex A: Reduced Complexity 8 kb/s CS-ACELP Codec for Digital Simultaneous Voice and Data", IEEE Communications Magazine, IEEE Service Center, New York, NY, vol. 35, No. 9, Sep. 1997, pp. 56-63, XP000704424.

Kyung Tae Kim et al., "An Efficient Transcoding Algorithm for G.723.1 and EVRC Speech Coders", VTC Fall 2001, IEEE 54$^{th}$ Vehicular Technology Conference, Proceedings, Atlantic City, NJ, Oct. 7-11, 2001 vol. 1 of 4, pp. 1561-1564, XP010562224.

"Code Excited Linear Predication (CELP): High-Quality Speech at very low bit rates", Proc. of IEEE International Conference in Acoustic Speech and Signal Processing, pp. 937-940, 1985.

"Improving Transcoding Capability of Speech Coders in Clean and Frame erasured Channel Environment", Proc. of IEEE Workshop on Speech Coding 2000, pp. 78-80, 2000.

"AMR Speech Code; Transcoding Functions" (3GPP TS 26.090), 2001.

* cited by examiner

METHOD AND DEVICE FOR CODE CONVERSION BETWEEN AUDIO ENCODING/DECODING METHODS AND STORAGE MEDIUM THEREOF

This patent application is a §371 of PCT/JP03/06378 (International Publication No. WO 03/098603 A1) which in turn claims priority of Japanese Patent Application No. 2002-147485, filed on May 22, 2002, the entire contents of which are incorporated herein by reference.

BACKGROUND OF THE INVENTION

1. Field of the Invention

The invention relates to a method of encoding and decoding an audio signal for transmitting audio signals at a low bit rate or accumulating audio signal, and more particularly to a method and an apparatus for code conversion and a program used therefor all of which converts a code obtained by encoding audio in accordance with a process, into a code decodable in accordance with another process in high audio quality and with a small amount of calculation.

2. Description of the Related Art

As a method of encoding an audio signal with high efficiency and at a low or middle bit rate, there are known methods of encoding an audio signal, including the step of demultiplexing an audio signal into a linear prediction (LP) filter and an excitation signal in accordance with which the linear prediction filter is driven.

A typical one among such methods is code excited linear prediction (CELP).

In accordance with code excited linear prediction, a LP filter having a LP coefficient indicative of frequency characteristic of input audio is driven with an excitation signal expressed with a sum of an adaptive codebook (ACB) indicative of a pitch cycle of input audio and a fixed codebook (FCB) comprised of a random number and a pulse, to thereby generate a synthesis audio signal. In the generation of a synthesis audio signal, ACB and FCB parts are multiplied with ACB and FCB gains, respectively.

Code excited linear prediction (CELP) is described in M. R. Schroeder and B. S. Atal, "Code Excited Linear Predication (CELP): High-Quality Speech at very low bit rates", Proc. of IEEE International Conference in Acoustic Speech and Signal Processing, pp. 937-940, 1985 (hereinbelow, referred to as "reference 1").

For instance, if a 3G (third generation) mobile network and a wire packet network are connected to each other, there is caused a problem that it would not be possible to directly connect the networks to each other, because standard processes for encoding audio used in the networks are different from each other.

The simplest solution to the problem is tandem connection.

In tandem connection, an audio signal (code string) is generated by encoding audio in accordance with a first standard process, then, the audio signal is decoded in accordance with the first standard process, and then, the thus decoded audio signal is encoded again in accordance with a second standard process.

That is, an audio signal is encoded twice, and decoded once. Hence, an audio signal is encoded once greater than a case in which an audio signal is encoded and decoded in accordance with a certain process for encoding/decoding audio, resulting in problems of reduction in audio quality, increase in delay and increase in an amount of calculation.

In contrast, there has been suggested a process for converting a code in a code region or an encoded parameter region such that a code obtained by encoding audio in accordance with one of standard processes is decodable in accordance with the other of standard processes. The suggested process is effective to the above-mentioned problems.

The above-mentioned process is described in Hong-Goo Kang et al., "Improving Transcoding Capability of Speech Coders in Clean and Frame Erasured Channel Environment", Proc. of IEEE Workshop on Speech Coding 2000, pp. 78-80, 2000 (hereinbelow, referred to as "reference 2").

FIG. 10 is a block diagram of an example of a conventional code-conversion apparatus 1500 which converts a code obtained by encoding audio in accordance with a first audio-encoding process (hereinbelow, referred to simply as "a first process"), into a code decodable in accordance with a second audio-decoding process (hereinbelow, referred to simply as "a second process").

The conventional code-conversion apparatus 1500 is comprised of an input terminal 10, a code-demultiplexing circuit 1010, a LP coefficient code conversion circuit 100, an ACB code conversion circuit 200, a FCB code conversion circuit 300, a gain code conversion circuit 400, a code-multiplexing circuit 1020, and an output terminal 20.

A first code string obtained by encoding audio in accordance with the first process is input into the code-demultiplexing circuit 1010 through the input terminal 10.

The code-demultiplexing circuit 1010 demultiplexes a linear prediction coefficient (hereinbelow, referred to as "LP coefficient"), ACB (adaptive codebook), FCB (fixed codebook), and codes corresponding to an ACB gain and a FCB gain, that is, a LP coefficient code, an ACB code, a FCB code and gain codes, out of the first code string.

Herein, it is assumed that an ACB gain and a FCB gain are encoded and decoded together. For simplification of explanation, ACB and FCB gains are referred to as "a gain", and codes of them are referred to as "a gain code" hereinafter. In order to distinguish these codes from later-mentioned, similar codes, a LP coefficient code, an ACB code, a FCB code and a gain code demultiplexed by the code-demultiplexing circuit 1010 out of the first code string are referred to hereinbelow as "a first LP coefficient", "a first ACB code", "a first FCB code" and "a first gain code", respectively.

The code-demultiplexing circuit 1010 outputs the first LP coefficient code to the LP coefficient code conversion circuit 100, the first ACB code to the ACB code conversion circuit 200, the first FCB code to the FCB code conversion circuit 300, and the first gain code to the gain code conversion circuit 400.

The LP coefficient code conversion circuit 100 receives the first LP coefficient code from the code-demultiplexing circuit 1010, and decodes the first LP coefficient code in accordance with a method of decoding a LP coefficient in the first process to thereby have a first LP coefficient. Then, the LP coefficient code conversion circuit 100 quantizes and encodes the first LP coefficient in accordance with a method of quantizing and encoding a LP coefficient in the second process, to thereby have a second LP coefficient code. The second LP coefficient code is a LP coefficient code decodable in accordance with the second process. Then, the LP coefficient code conversion circuit 100 outputs the second LP coefficient code to the code-multiplexing circuit 1020.

The ACB code conversion circuit 200 receives the first ACB code from the code-demultiplexing circuit 1010, and coverts the received first ACB code into an ACB code decodable in accordance with the second process. The ACB code conversion circuit 200 outputs the resultant ACB code to the code-multiplexing circuit 1020 as a second ACB code.

The FCB code conversion circuit 300 receives the first FCB code from the code-demultiplexing circuit 1010, and coverts the received first FCB code into a FCB code decodable in accordance with the second process. The FCB code conversion circuit 300 outputs the resultant FCB code to the code-multiplexing circuit 1020 as a second FCB code.

The gain code conversion circuit 400 receives the first gain code from the code-demultiplexing circuit 1010, and decodes the received first gain code in accordance with the first process to thereby have a gain. Then, the gain code conversion circuit 400 quantizes and encodes the first gain in accordance with a method of quantizing and encoding a gain in the second process, to thereby have a second gain code. The resultant second gain code is a gain code decodable in accordance with the second process. Then, the gain code conversion circuit 400 outputs the second gain code to the code-multiplexing circuit 1020.

The code-multiplexing circuit 1020 receives the second LP coefficient code from the LP coefficient code conversion circuit 100, the second ACB code from the ACB code conversion circuit, the second FCB code from the FCB code conversion circuit 300, and the second gain code from the gain code conversion circuit 400, and multiplexes them with one another to thereby have a code string. The code-multiplexing circuit 1020 outputs the resultant code string through the output terminal 20 as a second code string.

The conventional code conversion apparatus illustrated in FIG. 10 is accompanied with a problem that in conversion of a FCB code corresponding to FCB expressed with a multi-pulse signal, if the number of pulses in FCB which is in conformity to the first process is different from the number of pulses in FCB which is in conformity to the second process, it would be impossible to accomplish conversion of all FCB codes.

This is because that if the number of pulses in the first process is different from the number of pulses in the second process, there would exist a pulse to which the correspondence in a pulse location code between the first and second processes cannot be applied.

Japanese Patent Application Publication No. 6-222796 has suggested a system for encoding an audio code, including a linear prediction analyzer for obtaining a spectrum parameter of an input audio signal divided into frames every certain interval, an adaptive codebook having an audio-source signal having been determined in the past, an audio-source codebook for vector-quantizing an excitation audio-source of the input audio signal, and a gain codebook for quantizing a gain in each of the adaptive codebook and the audio-source codebook. When the adaptive codebook, the audio-source codebook and the gain codebook are retrieved for each of sub-frames further divided from the frame, there is generated an auditory-sense weighted audio signal having a length equal to a length of the sub-frame, through the use of the input audio signal and the spectrum parameter, and a response signal obtained by providing an input audio signal of a current sub-frame as an initial value with a synthesis filter using the spectrum parameter is obtained in a predetermined length. The response signal is weighted with the spectrum parameter to thereby have an overlap signal. The adaptive codebook, the audio-source codebook and the gain codebook are retrieved in accordance with a signal to which the overlap signal is connected following the auditory-sense weighted audio signal.

Japanese Patent Application Publication No. 8-146997 has suggested a code-conversion system for converting a multiplexed code in conformity to a first audio-encoding process into a multiplexed code in conformity to a second audio-encoding process, including a code-demultiplexer receiving a multiplexed code encoded in accordance with the first audio-encoding process, and demultiplexing the multiplexed code into each codes, a converter converting the codes demultiplexed by the code-demultiplexer, into codes which are in conformity to the second audio-encoding process, in accordance with a correspondence between codes which are in conformity to the first audio-encoding process and codes which are in conformity to the second audio-encoding process, and a multiplexer multiplexing codes having been converted into codes which are in conformity to the second audio-encoding process, by the converter.

Japanese Patent Application Publication No. 10-282997 has suggested an audio-encoder for multiplexing an excitation signal expressed with a multi-pulse signal comprised of a plurality of pulses such that strain between a reproduced audio signal obtained by exciting a linear prediction synthesis filter with the excitation signal, and an input audio signal is minimized. The suggested audio-encoder includes a circuit which determines a pulse location in such a manner that a pulse location where a pulse is not arranged yet is preferential to a pulse location where a pulse has been encodes at stages immediately previous and before.

Japanese Patent Application Publication No. 2001-134296 has suggested a method of decoding an audio signal including the steps of decoding information of an audio-source signal, a gain, and a linear prediction coefficient, out of a received signal, generating an excitation signal and the linear prediction coefficient, based on the decoded information, and driving a filter having the linear prediction coefficient, with the excitation signal to thereby decode an audio signal. The method is characterized by a first step of smoothing the gain in accordance with the past gains, a second step of controlling the thus smoothed gain in accordance with fluctuation calculated, based on the gain and the smoothed gain, and a third step of decoding the audio signal with the smoothed and controlled gain.

SUMMARY OF THE INVENTION

In view of the above-mentioned problem, it is a primary object of the present invention to provide a code-conversion apparatus, a code-conversion method, and a program for code-conversion all of which are capable of accomplishing conversion of all of FCB codes to the second process from the first process, even if the number of pulses in a fixed codebook (FCB) which is in conformity to the first process is different from the number of pulses in FCB which is in conformity to the second process.

In one aspect of the present invention, there is provided a method of converting a first code string to a second code string, including a first step of obtaining a first linear prediction coefficient and excitation-signal information, based on a first code string, a second step of generating an excitation signal, based on the excitation-signal information, a third step of generating a first audio signal by driving a filter having the first linear prediction coefficient with the excitation signal, a fourth step of generating a second audio signal, based on information obtained from the second code string, and a fifth step of obtaining fixed-codebook information in the second code string, based on the first and second audio signals, through the use of fixed-codebook information included in the excitation-signal information.

In the code-conversion method in accordance with the present invention, a part of fixed codebook codes which are in conformity to a second process is obtained, based on fixed codebook codes which are in conformity to a first process, by changing codes in accordance with certain correspondence to thereby convert fixed codebook codes. In addition, a fixed codebook signal is generated through the use of a decoded audio signal generated based on information including a linear prediction coefficient in a first process, an adaptive codebook signal, and a gain. A fixed codebook code in conformity to the second process is comprised of a code corresponding to the fixed codebook signal and the partial codebook codes.

Thus, it is possible to calculate a pulse location and a pulse sign for each of the number of pulses necessary for a fixed codebook in conformity to the second process.

Accordingly, even if the number of pulses in a fixed codebook which is in conformity to the first process is different from the number of pulses in a fixed codebook which is in conformity to the second process, it would be possible to accomplish conversion of all of fixed codebook codes.

For instance, the fixed-codebook information included in the excitation-signal information may be used in the fifth step as a part of the fixed-codebook information in the second code string.

The fixed-codebook information in the second code string may be obtained in the fifth step by minimizing a distance between the second audio signal and the first audio signal.

For instance, the fixed-codebook information may be comprised of a pulse location and a pulse sign of a multi-pulse signal.

For instance, a pulse location included in the excitation-signal information may be selected as a candidate of a pulse location in the second code string, and a distance between the second audio signal and the first audio signal may be minimized for the candidate of a pulse location.

The present invention further provides an apparatus for converting a first code string to a second code string, including an audio-decoding circuit which obtains a first linear prediction coefficient and excitation-signal information, based on a first code string, and generates a first audio signal by driving a filter having the first linear prediction coefficient with an excitation signal obtained from the excitation-signal information, and a fixed-codebook code generation circuit which obtains fixed-codebook information in the second code string, based on a second audio signal generated, based on information obtained from the second code string, and the first audio signal, through the use of fixed-codebook information included in the excitation-signal information.

The code-conversion apparatus in accordance with the present invention provides the same advantages as those provided by the above-mentioned code-conversion method in accordance with the present invention.

For instance, the fixed-codebook code generation circuit may use the fixed-codebook information as a part of the fixed-codebook information in the second code string.

The fixed-codebook code generation circuit may obtain the fixed-codebook information in the second code string by minimizing a distance between the second audio signal and the first audio signal.

For instance, the fixed-codebook information may be comprised of a pulse location and a pulse sign of a multi-pulse signal.

For instance, the fixed-codebook code generation circuit may select a pulse location included in the excitation-signal information as a candidate of a pulse location in the second code string, and may minimize a distance between the second audio signal and the first audio signal for the candidate of a pulse location.

The present invention further provides a program for causing a computer to carry out a method of converting a first code string to a second code string, wherein steps executed by the computer in accordance with the program includes a first step of obtaining a first linear prediction coefficient and excitation-signal information, based on a first code string, a second step of generating an excitation signal, based on the excitation-signal information, a third step of generating a first audio signal by driving a filter having the first linear prediction coefficient with the excitation signal, a fourth step of generating a second audio signal, based on information obtained from the second code string, and a fifth step of obtaining fixed-codebook information in the second code string, based on the first and second audio signals, through the use of fixed-codebook information included in the excitation-signal information.

For instance, the fixed-codebook information included in the excitation-signal information may be used in the fifth step as a part of the fixed-codebook information in the second code string.

The fixed-codebook information in the second code string may be obtained in the fifth step by minimizing a distance between the second audio signal and the first audio signal.

The fixed-codebook information may be comprised of a pulse location and a pulse sign of a multi-pulse signal.

For instance, a pulse location included in the excitation-signal information may be selected as a candidate of a pulse location in the second code string, and a distance between the second audio signal and the first audio signal may be minimized for the candidate of a pulse location in the fifth step.

The above-mentioned program may be stored in a storage medium.

The present invention further provides a code-conversion apparatus, including a code-demultiplexing circuit which demultiplexes multiplexed codes, and a code-multiplexing circuit which multiplexes codes, wherein code string data resulted from multiplexing codes obtained by encoding an audio signal in accordance with a first encoding process is demultiplexed into codes in the code-demultiplexing circuit, the thus demultiplexed codes are converted into codes which are in conformity to a second process different from the first process, the thus converted codes are transmitted to the code-multiplexing circuit, and the converted codes are multiplexed with one another in the code-multiplexing circuit to thereby generate code string data, characterized by an audio-decoding circuit which decodes excitation-signal information including an adaptive codebook code, a fixed codebook code and a gain code all of which are in conformity to the first process and which were demultiplexed in the code-demultiplexing circuit, and drives a synthesis filter having a first linear prediction coefficient decoded in accordance with the first process, with an excitation signal obtained from the excitation-signal information, based on a linear prediction coefficient code demultiplexed in the code-demultiplexing circuit, to thereby synthesize a decoded audio signal, and a fixed codebook code generation circuit which obtains at least a part of a fixed codebook code which is in conformity to the second process, from a fixed codebook code which is in conformity to the first process, by changing a code to thereby convert a fixed codebook code, obtains a fixed codebook signal through the use of the decoded audio signal, and generates a fixed codebook code which is in conformity to the second process by combining a fixed codebook code associated with the fixed codebook signal with the partial fixed codebook code obtained by changing the code.

The fixed-codebook signal may be expressed with a multi-pulse signal defined with a pulse location and a pulse sign.

The code-conversion apparatus may further include a circuit which generates a first linear prediction coefficient decoded in accordance with the first process and a second linear prediction coefficient decoded in accordance with the second process, based on the linear prediction coefficient code demultiplexed in the code-demultiplexing circuit, an adaptive codebook code conversion circuit which generates an adaptive codebook code which is in conformity to the second process, by changing an adaptive codebook code which is in conformity to the first process and which is input from the code-demultiplexing circuit, in accordance with the correspondence between codes in conformity to the first process and codes in conformity to the second process, and transmits adaptive codebook delay corresponding to an adaptive codebook code in conformity to the second process, to a later-mentioned target signal calculation circuit as second adaptive codebook delay, an impulse response calculation circuit which defines an auditory sense weighted synthesis filter through the use of the first an second linear prediction coefficients, and outputs an impulse response signal of the auditory sense weighted synthesis filter, and a target signal calculation circuit which calculates a first target signal, based on the decoded audio signal and the first and second linear prediction coefficients, calculates a second adaptive codebook signal and an optimal adaptive codebook gain, based on the second adaptive codebook signal, a second excitation signal generated in the past in accordance with the second fixed codebook signal and the gain signal, the impulse response signal, the first target signal, and the second adaptive codebook delay, and outputs the first target signal, the optimal adaptive codebook gain and the second adaptive codebook signal, wherein the fixed codebook code generation circuit generates a fixed codebook code which is in conformity to the second process, with respect to a pulse to which a correspondence between the first and second processes can be applied, by changing the first fixed codebook code in accordance with the correspondence, selects such a pulse location and a pulse sign that a distance between a fixed codebook signal and a second target signal is minimized, with respect to a pulse to which the correspondence cannot be applied, the fixed codebook signal being filtered through convolution operation of the fixed codebook signal and the impulse response signal, the second target signal being resulted from subtracting a signal obtained by multiplying the optimal adaptive codebook gain with a second adaptive codebook signal filtered by convolution of the second adaptive codebook signal and the impulse response signal, from the first target signal, defines a fixed codebook signal defined by a pulse location and a pulse sign resulted from changing the first fixed codebook code, and a pulse location and a pulse sign resulted from the selection, as a second fixed codebook signal, and outputs a code decodable in accordance with the second process and corresponding to the second fixed codebook signal, as a second fixed codebook code.

The present invention further provides a code-conversion apparatus, including a code-demultiplexing circuit which demultiplexes multiplexed codes, and a code-multiplexing circuit which multiplexes codes, wherein code string data resulted from multiplexing codes obtained by encoding an audio signal in accordance with a first encoding process is demultiplexed into codes in the code-demultiplexing circuit, the thus demultiplexed codes are converted into codes which are in conformity to a second process different from the first process, the thus converted codes are transmitted to the code-multiplexing circuit, and the converted codes are multiplexed with one another in the code-multiplexing circuit to thereby generate code string data, characterized by a linear prediction coefficient generation circuit, an audio-decoding circuit, an impulse response calculation circuit, and a fixed codebook code generation circuit, wherein the linear prediction coefficient generation circuit which generates a first linear prediction coefficient decoded in accordance with the first process and a second linear prediction coefficient decoded in accordance with the second process, based on the linear prediction coefficient code demultiplexed in the code-demultiplexing circuit, the audio-decoding circuit decodes excitation-signal information including an adaptive codebook code demultiplexed in the code-demultiplexing circuit, and drives a synthesis filter having a first linear prediction coefficient, with an excitation signal obtained from the excitation-signal information, to thereby synthesize and output a decoded audio signal, the impulse response calculation circuit defines an auditory sense weighted synthesis filter through the use of the first an second linear prediction coefficients, and outputs an impulse response signal of the auditory sense weighted synthesis filter, the fixed codebook code generation circuit generates a fixed codebook code which is in conformity to the second process, with respect to a pulse to which a correspondence between the first and second processes can be applied, by changing the first fixed codebook code in accordance with the correspondence, selects such a pulse location and a pulse sign that a distance between a fixed codebook signal and a second target signal is minimized, with respect to a pulse to which the correspondence cannot be applied, the fixed codebook signal being filtered through convolution operation of the fixed codebook signal and the impulse response signal, the second target signal being resulted from subtracting a signal obtained by multiplying the optimal adaptive codebook gain with a adaptive codebook signal filtered by convolution of the adaptive codebook signal and the impulse response signal, from the first target signal, defines a fixed codebook signal defined by a pulse location and a pulse sign resulted from changing the first fixed codebook code, and a pulse location and a pulse sign resulted from the selection, as a second fixed codebook signal, and outputs a code decodable in accordance with the second process and corresponding to the second fixed codebook signal, as a second fixed codebook code.

The above-mentioned code-conversion apparatus may further include an ACB code conversion circuit which changes a first ACB code received from the code-demultiplexing circuit, into a second ACB code in accordance with a correspondence between codes in conformity to the first process and codes in conformity to the second process, and outputs ACB delay associated with the second ACB code, as second ACB delay.

The above-mentioned code-conversion apparatus may further include a target signal calculation signal which calculates a first target signal, based on the decoded audio signal and the first and second linear prediction coefficients, and calculates a second ACB signal and an optimal ACB gain, based on a second excitation signal, the impulse response signal, the first target signal, and the second ACB delay, a gain code generation circuit which selects an ACB gain and a FCB gain which minimize a weighted square error of the first target signal and reconstructed audio, generates a code decodable in accordance with the second process and corresponding to the thus selected ACB gain and FCB gain, as a second gain code, and outputs the selected ACB gain and FCB gain as a second ACB gain and a second FCB gain, respectively, a second excitation-signal calculation circuit which generates a second excitation signal by adding a signal resulted from multiplying the second ACB signal with the second ACB gain, to a signal resulted from multiplying the second FCB signal with the second FCB gain, and a second excitation-signal storage circuit which stores the second excitation signal therein, and outputs a second excitation signal stored therein.

The advantages obtained by the aforementioned present invention will be described hereinbelow.

The present invention provides an advantage that conversion of all of FCB codes can be accomplished, even if the number of pulses in a fixed codebook (FCB) which is in conformity to a first process and the number of pulses in FCB which is in conformity to a second process are different from each other.

This is because that in accordance with the present invention, FCB codes in conformity to a first process are converted into a part of FCB codes in conformity to a second process by changing codes, a FCB signal is generated through the use of decoded audio generated based on information including a linear prediction coefficient in conformity to a first process, an adaptive codebook (ACB) signal and a gain, and a code corresponding to the FCB signal and a FCB code obtained by changing codes are combined with each other to thereby constitute a FCB code in conformity to a second process.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
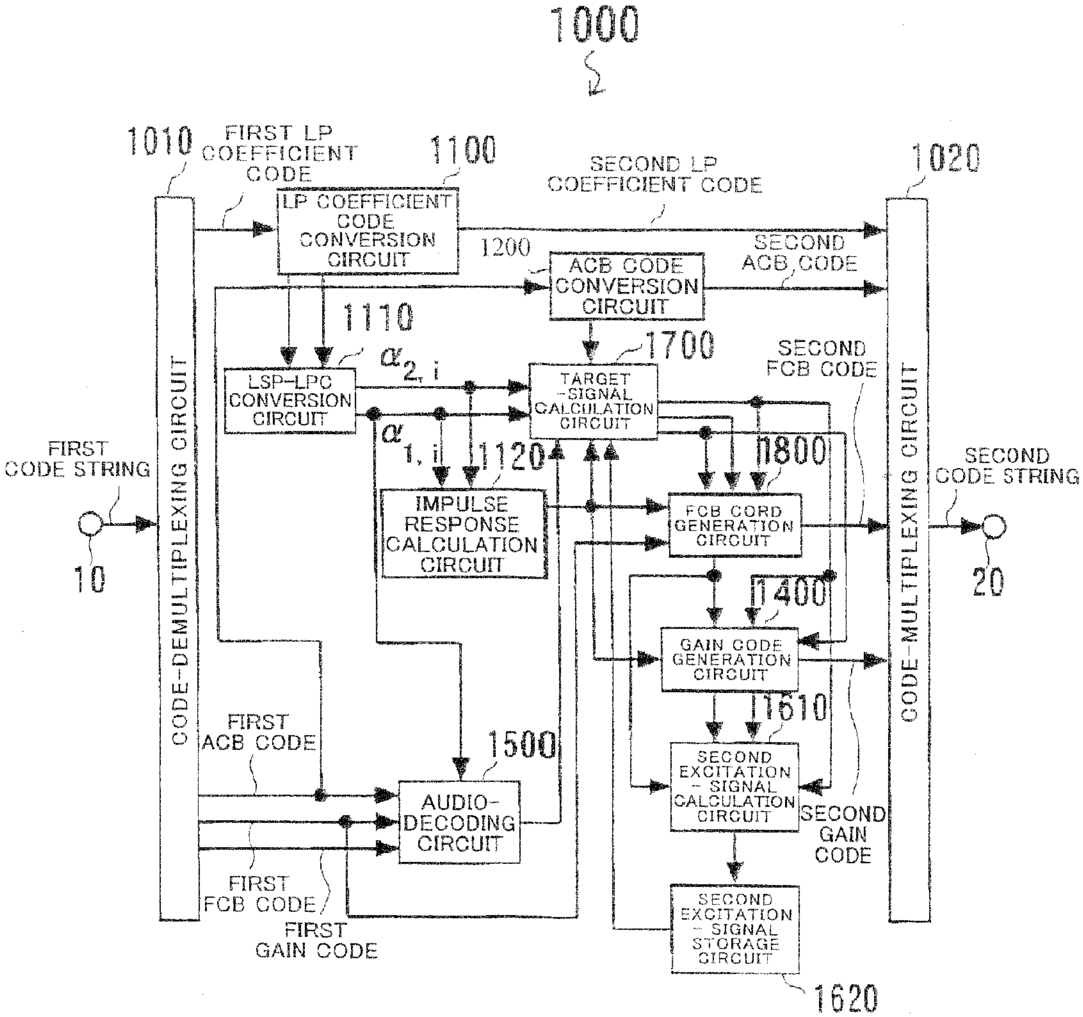
FIG. 1 is a block diagram of an apparatus for converting codes, in accordance with the first embodiment of the present invention.

FIG. 1 is a block diagram of an apparatus 1000 for converting codes, in accordance with the first embodiment of the present invention. In the code-conversion apparatus 1000 illustrated in FIG. 1, parts or elements that correspond to those of the conventional code-conversion apparatus 1500 illustrated in FIG. 10 have been provided with the same reference numerals.

The code-conversion apparatus 1000 in accordance with the first embodiment is comprised of an input terminal 10, a code-demultiplexing circuit 1010, a LP coefficient code conversion circuit 1100, a LSP-LPC conversion circuit 1110, an impulse response calculation circuit 1120, an ACB code conversion circuit 1200, an audio-decoding circuit 1500, a target-signal calculation circuit 1700, a FCB code generation circuit 1800, a gain code generation circuit 1400, a second excitation-signal calculation signal 1610, a second excitation-signal storage circuit 1620, a code-multiplexing circuit 1020, and an output terminal 20.

Figure 10:
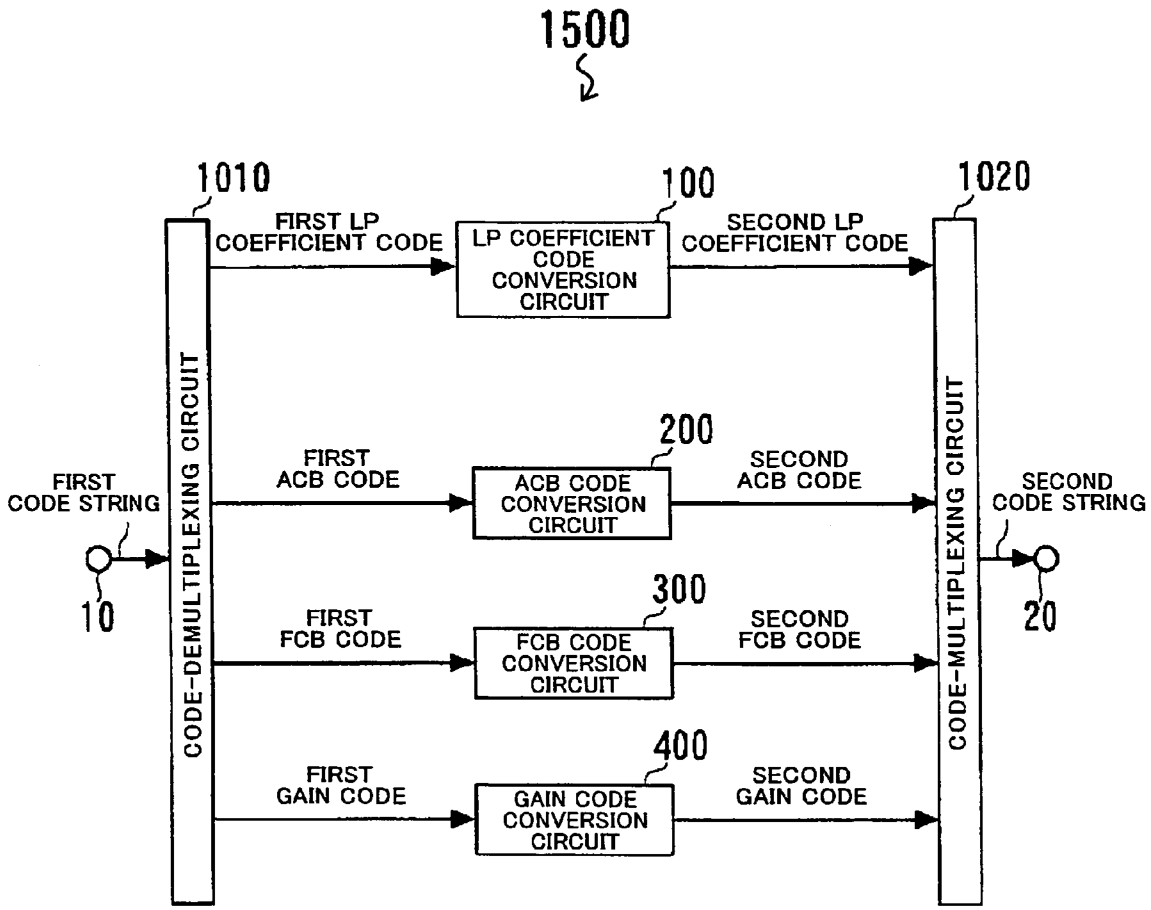
FIG.10 (PRIOR ART)
FIG. 10 is a block diagram of a conventional apparatus for converting codes.

In the code-conversion apparatus 1000 in accordance with the first embodiment, the input terminal 10, the output terminal 20, the code-demultiplexing circuit 1010 and the code-multiplexing circuit 1020 are substantially identical with the corresponding terminals or circuits illustrated in FIG. 10 except that a wire partially braches. Hereinbelow, the parts or elements that correspond to those of the conventional code-conversion apparatus 1500 illustrated in FIG. 10 are not explained, but only differences from the conventional code-conversion apparatus 1500 are explained.

In the first embodiment, a LP coefficient in accordance with a first process is encoded in a cycle (frame) of $$T_{fr}^{(A)} \tag{1}$$

milliseconds (msec), and parts constituting an excitation signal, such as ACB (adaptive codebook), FCB (fixed codebook) and a gain, are encoded in a cycle (sub-frame) of $$T_{sfr}^{(A)} = T_{fr}^{(A)} / N_{sfr}^{(A)} \tag{2}$$

milliseconds.

A LP coefficient in accordance with a second process is encoded in a cycle (frame) of $$T_{fr}^{(B)} \tag{3}$$

milliseconds (msec), and parts constituting an excitation signal, such as ACB (adaptive codebook), FCB (fixed codebook) and a gain, are encoded in a cycle (sub-frame) of $$T_{sfr}^{(B)} = T_{fr}^{(B)} / N_{sfr}^{(B)} \tag{4}$$

A frame length, the number of sub-frames and a sub-frame length in the first process are expressed as follows.

$$L_{fr}^{(A)} \tag{5}$$

$$N_{sfr}^{(A)} \tag{6}$$

$$L_{sfr}^{(A)} = L_{fr}^{(A)} / N_{sfr}^{(A)} \tag{7}$$

Similarly, a frame length, the number of sub-frames and a sub-frame length in the second process are expressed as follows.

$$L_{fr}^{(B)} \tag{8}$$

$$N_{sfr}^{(B)} \tag{9}$$

$$L_{sfr}^{(B)} = L_{fr}^{(B)} / N_{sfr}^{(B)} \tag{10}$$

For simplification of the explanation made hereinbelow, the following assumption is made.

$$L_{fr}^{(A)} = L_{fr}^{(B)} \tag{11}$$

$$N_{sfr}^{(A)} = N_{sfr}^{(B)} = 2 \tag{12}$$

$$L_{sfr}^{(A)} = L_{sfr}^{(B)} \tag{13}$$

Herein, if it is assumed that a sampling frequency is 8000 Hz, for instance, and the cycles (1) and (3) at which the LP coefficients in conformity to $$T_{fr}^{(A)} \tag{1}$$

$$T_{fr}^{(B)} \tag{3}$$

are both 10 msec, $$L_{fr}^{(A)} \tag{5}$$

$$L_{fr}^{(B)} \tag{8}$$

are both 160 samples, and $$L_{sfr}^{(A)} \tag{7}$$

$$L_{sfr}^{(B)} \tag{10}$$

are both 80 samples.

The LP coefficient code conversion circuit 1100 receives a first LP coefficient from the code-demultiplexing circuit 1010.

In many standard processes such as "AMR Speech Code; Transcoding Functions" (3GPP TS 26.090) (hereinafter, referred to as "reference 3") or ITU-T Recommendation G.729, a LP coefficient is expressed with a linear spectral pair (LSP), and such a linear spectral pair (LSP) is encoded and decoded. Hence, it is assumed that a LP coefficient is encoded and decoded in a LSP region.

A LP coefficient is converted into LSP and LSP is converted into a LP coefficient both in accordance with a conventional manner. For instance, a LP coefficient is converted into LSP and LSP is converted into a LP coefficient both in accordance with the method suggested in the sections 5.2.3 and 5.2.4 in the reference 3.

The LP coefficient code conversion circuit 1100 decodes the first LP coefficient code received from the code-demultiplexing circuit 1010, into a first LSP in accordance with a method of decoding LSP in the first process.

Then, the LP coefficient code conversion circuit 1100 quantizes and encodes the first LSP in accordance with a method of quantizing and encoding LSP in the second process, to thereby have a second LSP and a second LP coefficient code associated with the second LSP.

Then, the LP coefficient code conversion circuit 1100 outputs the second LP coefficient code to the code-multiplexing circuit 1020 as a code decodable in accordance with a method of decoding LSP in the second process, and further outputs the first LSP and the second LSP to the LSP-LPC conversion circuit 1110.

Figure 2:
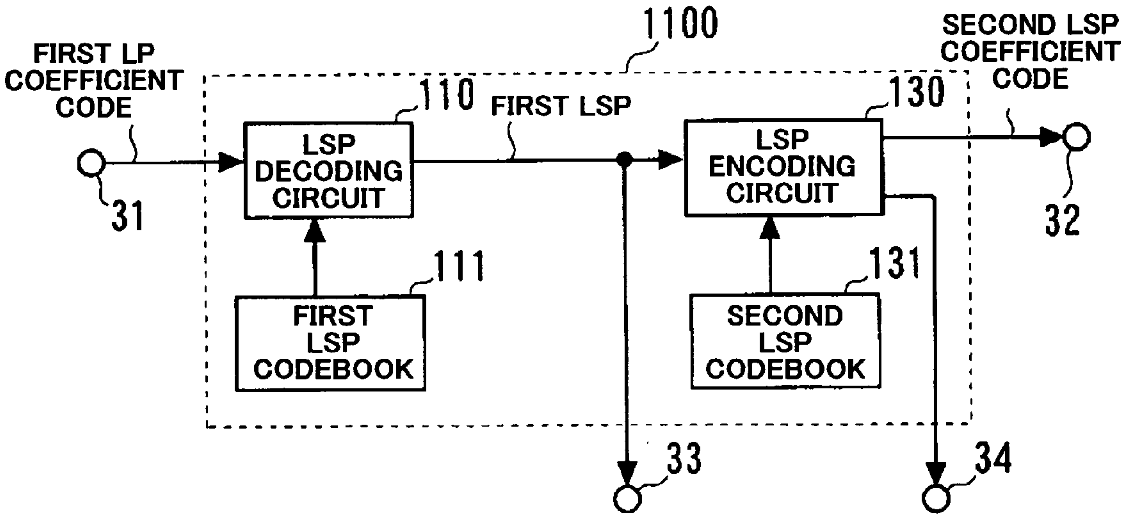
FIG. 2 is a block diagram of a LP coefficient code conversion circuit which is a part of the code-conversion apparatus in accordance with the first embodiment of the present invention.

FIG. 2 is a block diagram showing an example of a structure of the LP coefficient code conversion circuit 1100.

The LP coefficient code conversion circuit 1100 is comprised of a LSP decoding circuit 110, a first LSP codebook 111, a LSP encoding circuit 130, a second LSP codebook 131, an input terminal 31, and output terminals 32, 33 and 34, for instance.

The LSP decoding circuit 110 decodes a LP coefficient code into LSP associated with the LP coefficient code.

Specifically, the LSP decoding circuit 110 includes the first LSP codebook 111 storing a plurality of sets of LSP therein. On receipt of the first LP coefficient code from the code-demultiplexing circuit 1010 through the input terminal 31, the LSP decoding circuit 110 reads LSP corresponding to the first LP coefficient code, out of the first LSP codebook 111, and outputs the thus read-out LSP to the LSP encoding circuit 130 as a first LSP, and further to the LSP-LPC conversion circuit 1110 through the output terminal 33.

The LP coefficient code is decoded into LSP in accordance with a method of decoding a LP coefficient in the first process through the use of a LSP codebook in the first process (since the LSP coefficient code is expressed with LSP, LSP is decoded).

The LSP encoding circuit 130 receives a first LSP from the LSP decoding circuit 110, successively reads second LSPs and LP coefficient codes associated with the second LSPs out of the second LSP codebook 131, selects a second LSP which minimizes an error between a first LSP and the second LSP itself, outputs a LP coefficient code associated with the selected second LSP to the code-multiplexing circuit 1020 through the output terminal 32 as a second LP coefficient code, and further outputs the second LSP to the LSP-LPC conversion circuit through the output terminal 34.

The selection of the second LSP, that is, quantization and encoding of LSP is carried out in accordance with methods of quantizing and encoding LSP in the second process through the use of a LSP codebook in the second process. Quantization and encoding of LSP is described in the section 5.2.5 in the reference 3, for instance.

Referring back to FIG. 1, the LSP-LPC conversion circuit 1110 receives the first and second LSPs from the LP coefficient code conversion circuit 1100, converts the first and second LSPs into a first LP coefficient $\alpha_{1,i}$ and a second LP coefficient $\alpha_{2,i}$, respectively, outputs the first LP coefficient $\alpha_{1,i}$ to the target signal calculation circuit 1700, the audio-decoding circuit 1500 and the impulse response calculation circuit 1120, and outputs the second LP coefficient $\alpha_{2,i}$ to the target signal calculation circuit 1700 and the impulse response calculation circuit 1120.

Conversion to a LP coefficient from LSP is described in the section 5.2.4 in the reference 3, for instance.

The ACB code conversion 1200 changes the first ACB code received from the code-demultiplexing circuit 1010, into a second ACB code in accordance with a correspondence in codes between the first and second processes. Then, the ACB code conversion 1200 outputs the second ACB code to the code-multiplexing circuit 1020 as a code decodable in accordance with a method of decoding ACB in the second process, and further outputs ACB delay associated with the second ACB code to the target-signal calculation circuit 1700 as a second ACB delay.

Herein, how a code is changed is explained with reference to FIG. 3.

For instance, it is assumed that an ACB code (14) in conformity to the first process $$i_T^{(A)} \tag{14}$$

is comprised of a code string 51, 52, 53, 54, 55 and 56, and ACB delay $T^{(A)}$ corresponding to the ACB code is comprised of a code string 71, 72, 73, 74, 75 and 76. Accordingly, for instance, an ACB code "56" corresponds to an ACB delay $T^{(A)}$ "76".

Similarly, it is assumed that an ACB code (14) in conformity to the second process $$i_T^{(B)} \tag{15}$$

is comprised of a code string 48, 49, 50, 51, 52 and 53, and ACB delay $T^{(B)}$ corresponding to the ACB code is comprised of a code string 71, 72, 73, 74, 75 and 76. Accordingly, for instance, an ACB code "53" corresponds to an ACB delay $T^{(B)}$ "76".

In conversion of an ACB code to the second process from the first process, an ACB code in conformity to the first process is made correspond to an ACB code in conformity to the second process such that the ACB delays $T^{(A)}$ and $T^{(B)}$ are equal to each other.

For instance, if an ACB delay is "76", an ACB code "56" in the first process is made correspond to an ACB code "53" in the second process. If an ACB delay is "71", an ACB code "51" in the first process is made correspond to an ACB code "48" in the second process.

The audio-decoding circuit 1500 receives a first ACB code, a first FCB code and a first gain code from the code-demultiplexing circuit 1010, and further receives the first LP coefficient $\alpha_{1,i}$ from the LSP-LPC conversion circuit 1110.

The audio-decoding circuit 1500 decodes the first ACB code, the first FCB code and the first gain code into an ACB delay, a FCB signal and a gain in accordance with a method of decoding an ACB signal, a method of decoding a FCB signal, and a method of decoding a gain, all in the first process, respectively. Hereinbelow, these are called a first ACB delay, a first FCB signal, and a first gain.

The audio-decoding circuit 1500 generates an ACB signal, based on the first ACB delay. Hereinbelow, the thus generated ACB signal is called a first ACB signal.

Then, the audio-decoding circuit 1500 decodes audio, based on the first ACB signal, the first FCB signal, the first gain and the first LP coefficient, and outputs the generated audio to the target-signal calculation circuit 1700.

Figure 4:
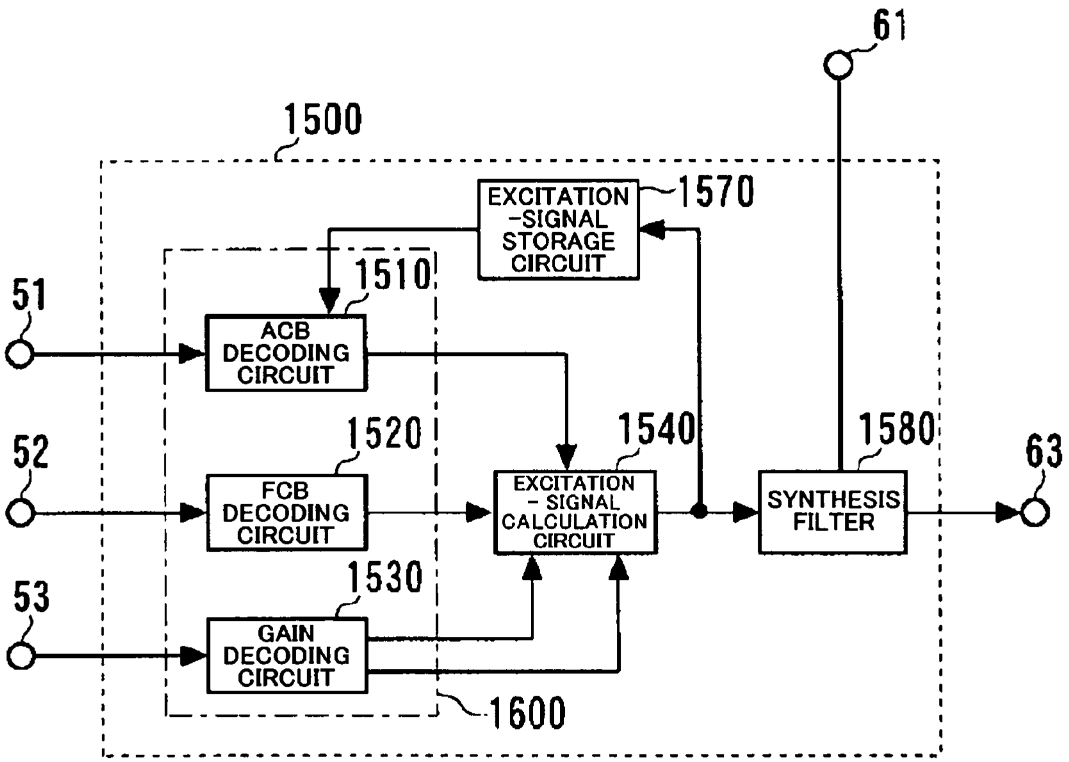
FIG. 4 is a block diagram of an audio-decoding circuit which is a part of the code-conversion apparatus in accordance with the first embodiment of the present invention.

FIG. 4 is a block diagram showing an example of a structure of the audio-decoding circuit 1500.

The audio-decoding circuit 1500 is comprised of an excitation-signal information decoding circuit 1600, an excitation-signal calculation circuit 1540, an excitation-signal storage circuit 1570, and a synthesis filter 1580. The excitation-signal information decoding circuit 1600 is comprised of an ACB decoding circuit 1510, a FCB decoding circuit 1520, and a gain decoding circuit 1530.

The excitation-signal information decoding circuit 1600 decodes excitation-signal information out of a code corresponding to excitation-signal information. In addition, the excitation-signal information decoding circuit 1600 receives the first ACB code, the first FCB code and the first gain code from the code-demultiplexing circuit 1010 through the input terminals 51, 52 and 53, respectively, and decodes the first ACB code, the first FCB code and the first gain code into an ACB delay, a FCB signal and a gain, respectively. These are the above-mentioned first ACB delay, first FCB signal and first gain. The first gain is comprised of an ACB gain and a FCB gain. Hereinbelow, such an ACB gain and a FCB gain are called a first ACB gain and a first FCB gain, respectively.

In addition, the excitation-signal information decoding circuit 1600 receives past excitation-signals from the excitation-signal storage circuit 1570, and generates an ACB signal, based on the received past excitation-signals and the first ACB delay. Hereinbelow, the thus generated ACB signal is referred to as a first ACB signal.

Then, the excitation-signal information decoding circuit 1600 outputs the first ACB signal, the first FCB signal, the first ACB gain and the first FCB gain to the excitation-signal calculation circuit 1540.

Hereinbelow are explained the ACB decoding circuit 1510, the FCB decoding circuit 1520 and the gain decoding circuit 1530 which are parts of the excitation-signal information decoding circuit 1600.

The ACB decoding circuit 1510 receives a first ACB code from the code-demultiplexing circuit 1010 through the input terminal 51, and further receives past excitation-signals from the excitation-signal storage circuit 1570.

Figure 3:
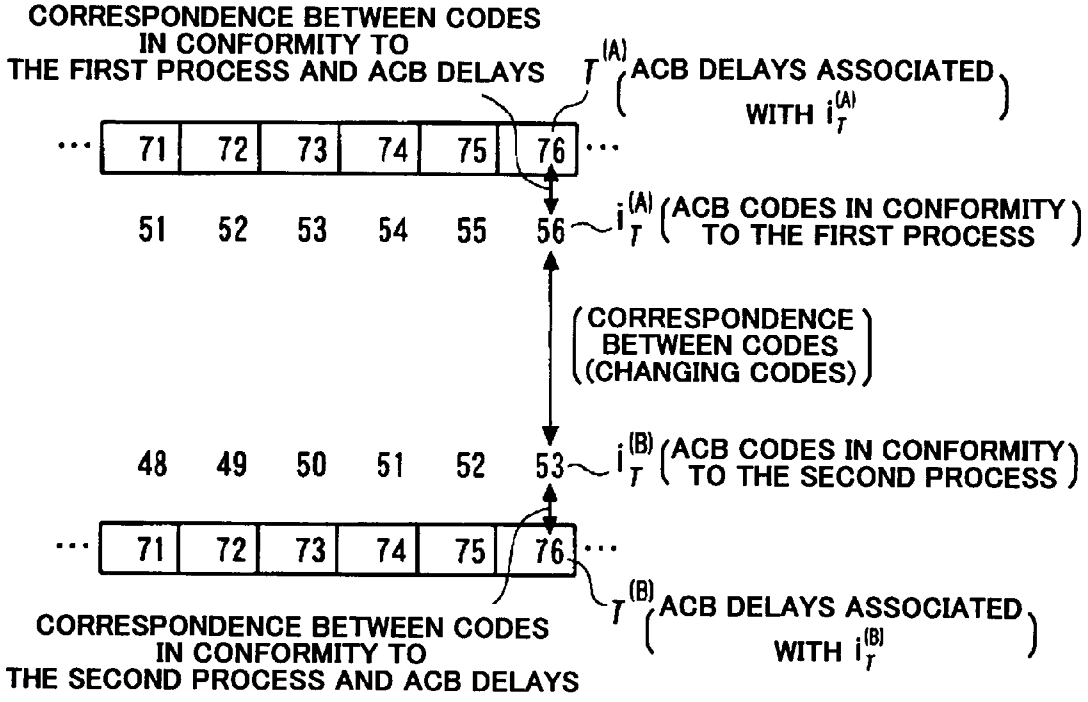
FIG. 3 illustrates a correspondence between ACB codes and ACB delays, and a process of changing ACB codes.

The ACB decoding circuit 1510 obtains a first ACB delay $T^{(A)}$ corresponding to the first ACB code in accordance with the correspondence between the ACB codes and the ACB delays in the first process, illustrated in FIG. 3, in the same way as mentioned earlier.

In addition, the ACB decoding circuit 1510 takes, in an excitation-signal, a signal of a sample having a length (7) equivalent to a sub-frame length out of a point starting from a starting point of a current sub-frame and going back to the past by $T^{(A)}$ samples.

$$L_{sfr}^{(A)} \tag{7}$$

The thus obtained signal makes a first ACB signal.

If $T^{(A)}$ is smaller than the length (7) equivalent to a sub-frame length, $$L_{sfr}^{(A)} \tag{7}$$

a vector for $T^{(A)}$ samples is taken out, and the vector is repeatedly connected to have a signal of a sample having the length (7).

$$L_{sfr}^{(A)} \tag{7}$$

Then, the ACB decoding circuit 1510 outputs the thus generated first ACB signal to the excitation-signal calculation circuit 1540.

A method of generating the first ACB signal is detailed in the sections 6.1 and 5.6 in the reference 3.

The FCB decoding circuit 1520 receives a first FCB code from the code-demultiplexing circuit 1010 through the input terminal 52, and outputs a first FCB signal associated with the received first FCB code, to the excitation-signal calculation circuit 1540.

A FCB signal is expressed with a multi-pulse signal defined by a pulse location and a pulse sign, and a first FCB code is comprised of a code (pulse location code) associated with a pulse location and a code (pulse sign code) associated with a pulse sign. A method of generating a FCB signal expressed with a multi-pulse signal is detailed in the sections 6.1 and 5.7 in the reference 3.

The gain decoding circuit 1530 receives a first gain code from the code-demultiplexing circuit 1010 through the input terminal 53. The gain decoding circuit 1530 includes a table (not illustrated) storing a plurality of gains therein, and reads a gain associated with the received first gain code out of the table.

Then, the gain decoding circuit 1530, among gains read out of the table, outputs a first ACB gain associated with the ACB gain and a first FCB gain associated with the FCB gain to the excitation-signal calculation circuit 1540.

If the first ACB gain and the first FCB gain are encoded together, the table (not illustrated) stores therein a plurality of two-dimensional vectors each comprised of a first ACB gain and a first FCB gain. If the first ACB gain and the first FCB gain are encoded separately from each other, the gain decoding circuit 1530 includes two tables (not illustrated), one of which stores a plurality of first ACB gains therein, and the other stores a plurality of first FCB gains therein.

The excitation-signal calculation circuit 1540 receives a first ACB signal from the ACB decoding circuit 1510, receives a first FCB signal from the FCB decoding circuit 1520, and further receives a first ACB gain and a first FCB gain from the gain decoding circuit 1530.

The excitation-signal calculation circuit 1540 adds a signal obtained by multiplying the first ACB signal and the first ACB gain with each other to a signal obtained by multiplying the first FCB signal and the first FCB gain with each to thereby generate a first excitation-signal. The excitation-signal calculation circuit 1540 outputs the thus generated first excitation-signal to the synthesis filter 1580 and the excitation-signal storage circuit 1570.

The excitation-signal storage circuit 1570 receives a first excitation-signal from the excitation-signal calculation circuit 1540, and stores the received signal therein. On receipt of a first excitation-signal from the excitation-signal calculation circuit 1540, the excitation-signal storage circuit 1570 outputs the past first excitation-signals having been received in the past and storing therein, to the ACB decoding circuit 1510.

The synthesis filter 1580 receives a first excitation-signal from the excitation-signal calculation circuit 1540, and further receives a first LP coefficient $\alpha_{1,i}$ from the LSP-LPC conversion circuit 110 through the input terminal 61.

The synthesis filter 1580 acts as a linear prediction filter having the first LP coefficient $\alpha_{1,i}$, and is driven by a first excitation-signal output form the excitation-signal calculation circuit 1540 to thereby generate an audio signal.

The synthesis filter 1580 outputs the thus generated audio signal to the target-signal calculation circuit 1700 through the output terminal 63.

As illustrated in FIG. 1, the target-signal calculation circuit 1700 receives the first and second LP coefficients from the LSP-LPC conversion circuit 1110, a second ACB delay associated with the second ACB code, from the ACB code conversion circuit 1200, decoded audio from the audio-decoding circuit 1500, an impulse response signal from the impulse response calculation circuit 1120, and past second excitation-signals from the second excitation-signal storage circuit 1620.

The target-signal calculation circuit 1700 calculates a first target-signal, based on the decoded audio, the first LP coefficient, and the second LP coefficient.

Then, the target-signal calculation circuit 1700 calculates a second ACB signal and an optimal ACB gain, based on the past second excitation-signals, the impulse response signal, the second ACB delay and the first target signal.

Then, the target-signal calculation circuit 1700 outputs the first target signal to the FCB code generation circuit 1800 and the gain code generation circuit 1400, outputs the optimal ACB gain to the FCB code generation circuit 1800, and outputs the second ACB signal to the FCB code generation circuit 1800, the gain code generation circuit 1400 and the second excitation-signal calculation circuit 1610.

The impulse response calculation circuit 1120 receives the first LP coefficient $\alpha_{1,i}$ and the second LP coefficient $\alpha_{2,i}$, from the LSP-LPC conversion circuit 1110, and defines an auditory-sense weighted synthesis filter through the use of the first and second LP coefficients. The impulse response calculation circuit 1120 outputs an impulse response signal of the auditory-sense weighted synthesis filter to the target-signal generation circuit 1700, the FCB code generation circuit 1800 and the gain code generation circuit 1400.

A transfer function of the auditory-sense weighted synthesis filter is expressed with the following equation.

$$\frac{W(z)}{A_2(z)} = \frac{A_1(z/\gamma_1)}{A_2(z)A_1(z/\gamma_2)} \tag{16}$$

wherein $$\frac{1}{A_2(z)} = \frac{1}{1 + \sum_{i=1}^{P} \alpha_{2,i} z^{-i}} \tag{17}$$

is a transfer function of a linear prediction filter having a second LP coefficient $\alpha_{2,i}$, (i=1, . . . , P), and $$W(z) = \frac{A_1(z/\gamma_1)}{A_1(z/\gamma_2)} = \frac{1 + \sum_{i=1}^{P} \gamma_1^i \alpha_{1,i} z^{-i}}{1 + \sum_{i=1}^{P} \gamma_2^i \alpha_{1,i} z^{-i}} \tag{18}$$

is a transfer function of an auditory-sense weighted filter having a first LP coefficient $\alpha_{1,i}$, (i=1, . . . , P).

Herein, P indicates a linear prediction coefficient (for instance, 10), and each of $\gamma_1$ and $\gamma_2$ is a coefficient controlling weighting (for instance, $\gamma_1$=0.94, $\gamma_2$=0.6).

The FCB code generation circuit 1800 receives a first target signal, a second ACB signal and an optimal gain from the target-signal calculation circuit 1700, an impulse response signal from the impulse response calculation circuit 1120, and a first FCB code from the code-demultiplexing circuit 1010.

With respect to pulses to which a correspondence in codes between the first and second processes can be applied, the FCB code generation circuit 1800 changes a first FCB code into a part of a second FCB code in accordance with the correspondence.

A FCB signal is comprised of a plurality of pulses, and is expressed with a multi-pulse signal defined with a pulse location and a pulse sign. A FCB code is comprised of a code (pulse location code) associated with a pulse location and a code (pulse sign code) associated with a pulse sign. The code conversion can be carried out in accordance with a method used for the above-mentioned ACB code conversion.

A method of expressing a FCB signal with a multi-pulse signal is described in the section 5.7 in the reference 3, for instance.

Figure 5:
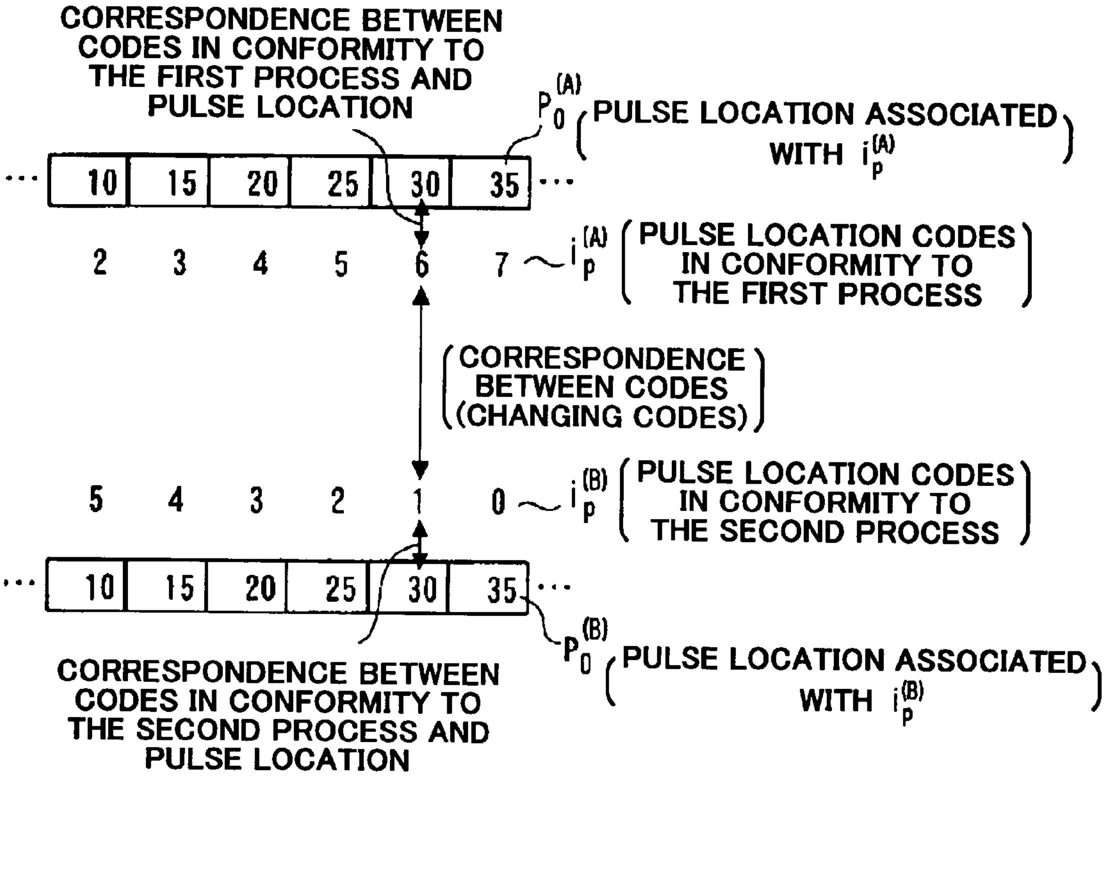
FIG. 5 illustrates a correspondence between pulse location codes and pulse locations, and a process of changing ACB codes.

Herein, how a pulse location code is changed is explained with reference to FIG. 5.

For instance, it is assumed that a pulse location code (19) in conformity to the first process $$i_P^{(A)} \tag{19}$$

is comprised of a code string 2, 3, 4, 5, 6 and 7, and a pulse location (20) corresponding to the pulse location code is comprised of a code string 10, 15, 20, 25, 30 and 35.

$$P_0^{(A)} \tag{20}$$

Accordingly, for instance, a pulse location code “6” corresponds to a pulse location “30”.

Similarly, it is assumed that a pulse location code (21) in conformity to the second process $$i_P^{(B)} \tag{21}$$

is comprised of a code string 5, 4, 3, 2, 1 and 0, and a pulse location (22) corresponding to the pulse location code is comprised of a code string 10, 15, 20, 25, 30 and 35.

$$P_0^{(B)} \tag{22}$$

Accordingly, for instance, a pulse location code “1” corresponds to a pulse location “30”.

Under the above-mentioned assumption, in conversion of a pulse location code to the second process from the first process, a pulse location code in conformity to the first process is made correspond to a pulse location code in conformity to the second process such that the pulse locations are equal to each other.

For instance, if a pulse location is “30”, a pulse location code “6” in the first process is made correspond to a pulse location code “1” in the second process. If a pulse location code is “10”, a pulse location code “2” in the first process is made correspond to a pulse location code “5” in the second process.

With respect to a pulse sign code, a pulse sign code is change into another code such that a sign (positive or negative) of a pre-changed code is identical with a sign of a post-changed code.

As mentioned earlier, the FCB code generation circuit 1800, for pulses to which a correspondence in codes between the first and second processes can be applied, changes a first FCB code into a part of a second FCB code in accordance with the correspondence. In contrast, the FCB code generation circuit 1800, for pulses to which the correspondence cannot be applied, selects such a pulse location and a pulse sign that a distance between a second target signal and a FCB signal filtered through convolution operation of the FCB signal and an impulse response signal is minimized. This is equivalent that a distance between audio generated by information obtained from a second code string and audio generated by information obtained from a first code string is minimized.

The second target signal is calculated, based on the first target signal, the second ACB signal, the optimal ACB gain, and the impulse response signal.

The FCB code generation circuit 1800 generates a FCB signal defined with a pulse location and a pulse sign obtained by changing a first FCB code, and the selected pulse location and pulse sign, as a second FCB signal.

Then, the FCB code generation circuit 1800 outputs a code decodable in accordance with the second process and corresponding to the second FCB signal, to the code-multiplexing circuit 1020 as a second FCB code, and outputs the second FCB signal to a gain encoding circuit 1410 and the second excitation-signal calculation circuit 1610.

The gain code generation circuit 1400 receives a first target signal and a second ACB signal from the target-signal calculation circuit 1700, a second FCB signal from the FCB code generation circuit 1800, and an impulse response signal from the impulse response calculation circuit 1120.

The gain code generation circuit 1400 selects an ACB gain and a FCB gain which minimize a weighted square error of the first target signal and reconstructed audio. Herein, the reconstructed audio is calculated, based on a second ACB signal, a second FCB signal and an impulse response signal, and an ACB gain and a FCB gain both stored in a table included in the gain code generation circuit 1400.

Then, the gain code generation circuit 1400 outputs a code decodable in accordance with the second process and corresponding to the thus selected ACB gain and FCB gain, to the code-multiplexing circuit 1020 as a second gain code, and further outputs the selected ACB gain and FCB gain to the second excitation-signal calculation circuit 1610 as a second ACB gain and a second FCB gain, respectively.

The second excitation-signal calculation circuit 1610 receives a second ACB signal from the target-signal calculation circuit 1700, a second FCB signal from the FCB code generation circuit 1800, and a second ACB gain and a second FCB gain from the gain code generation circuit 1400.

The second excitation-signal calculation circuit 1610 generates a second excitation-signal by adding a signal resulted from multiplying the second ACB signal with the second ACB gain, to a signal resulted from multiplying the second FCB signal with the second FCB gain. The second excitation-signal is output to the second excitation-signal storage circuit 1620.

The second excitation-signal storage circuit 1620 receives a second excitation-signal from the second excitation-signal calculation circuit 1610, and stores the same therein. On receipt of the second excitation-signal from the second excitation-signal calculation circuit 1610, the second excitation-signal storage circuit 1620 outputs the second excitation-signals having been received in the past and stored therein, to the target-signal calculation circuit 1700.

An example of each of the target-signal calculation circuit 1700, the FCB code generation circuit 1800 and the gain code generation circuit 1400 in the first embodiment is explained hereinbelow.

Figure 6:
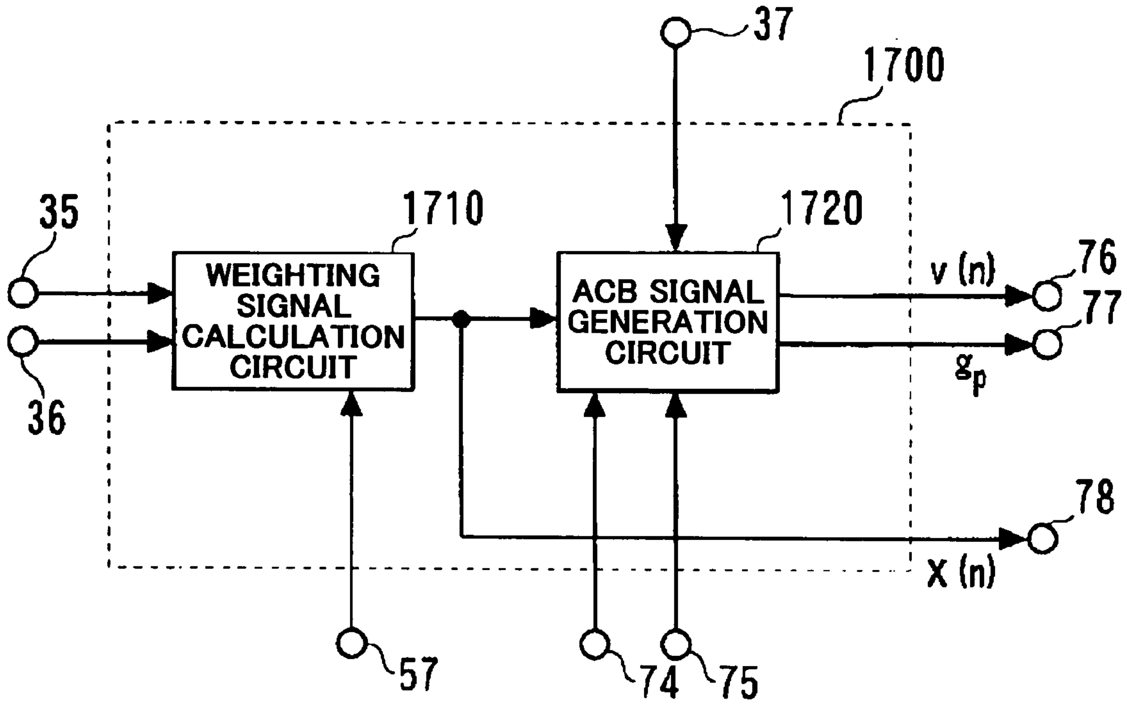
FIG. 6 is a block diagram of a target signal calculation circuit which is a part of the code-conversion apparatus in accordance with the first embodiment of the present invention.

FIG. 6 is a block diagram showing an example of a structure of the target-signal calculation circuit 1700 in the first embodiment.

As illustrated in FIG. 6, the target-signal calculation circuit 1700 is comprised of a weighting signal calculation circuit 1710 and an ACB signal generation circuit 1720.

The weighting signal calculation circuit 1710 receives decoded audio from the synthesis filter 1580 which is a part of the audio-decoding circuit 1500, through an input terminal 57, and first and second LP coefficients from the LSP-LPC conversion circuit 1110 through input terminals 36 and 35, respectively.

The weighting signal calculation circuit 1710 defines an auditory-sense weighted filter W(z) (see the equation (18)) through the use of the first LP coefficient. The auditory-sense weighted filter is driven with decoded audio output from the synthesis filter 1580, and thus, an auditory-sense weighted audio signal is generated.

In addition, the weighting signal calculation circuit 1710 defines an auditory-sense weighted synthesis filter $W(z)/A_2(z)$ (see the equation (16)) through the use of the first and second LP coefficients.

The weighting signal calculation circuit 1710 outputs a first target signal x(n) obtained by subtracting a zero-input response of the auditory-sense weighted synthesis filter from the auditory-sense weighted audio signal, to the ACB signal generation circuit 1720, and further outputs the first target signal x(n) to a later-mentioned second target signal calculation circuit 1820 and a gain encoding circuit 1410 through an output terminal 78.

The ACB signal generation circuit 1720 receives a first target signal x(n) from the weighting signal calculation circuit 1710, a second ACB delay from the ACB code conversion circuit 1200 through an input terminal 37, an impulse response signal from the impulse response calculation circuit 1120 through an input terminal 74, and past second excitation-signals from the second excitation-signal storage circuit 1620 through an input terminal 75.

The ACB signal generation circuit 1720 carries out convolution of a signal taken out of the past second excitation signals with a delay "k" and an impulse response signal to thereby calculate a past filtered excitation signal (23) having a delay "k".

$$y_k(n), n=0, \ldots, L_{sfr}^{(B)}-1 \tag{23}$$

Herein, the second ACB delay is used as a delay "k". Hereinafter, the signal taken out of the past second excitation signals with a delay "k" is referred to as a second ACB signal v(n).

The ACB signal generation circuit 1720 calculates an optimal ACB gain $g_p$ in accordance with the following equation (24) through the use of the first target signal x(n) and the past excitation signal $y_k(n)$.

$$g_p = \frac{\sum_{n=0}^{L_{sfr}^{(B)}-1} x(n)y_k(n)}{\sum_{n=0}^{L_{sfr}^{(B)}-1} y_k(n)y_k(n)} \tag{24}$$

The ACB signal generation circuit 1720 outputs the second ACB signal v(n) to the second target-signal calculation circuit 1810, the gain encoding circuit 1410 and the second excitation-signal calculation circuit 1610 through an output terminal 76, and further outputs the optimal ACB gain to the second target-signal calculation circuit 1810 through an output terminal 77.

A method of calculating a second ACB signal v(n) and a method of calculating an optimal ACB gain gp are detailed in the sections 6.1 and 5.6 in the reference 3.

Figure 7:
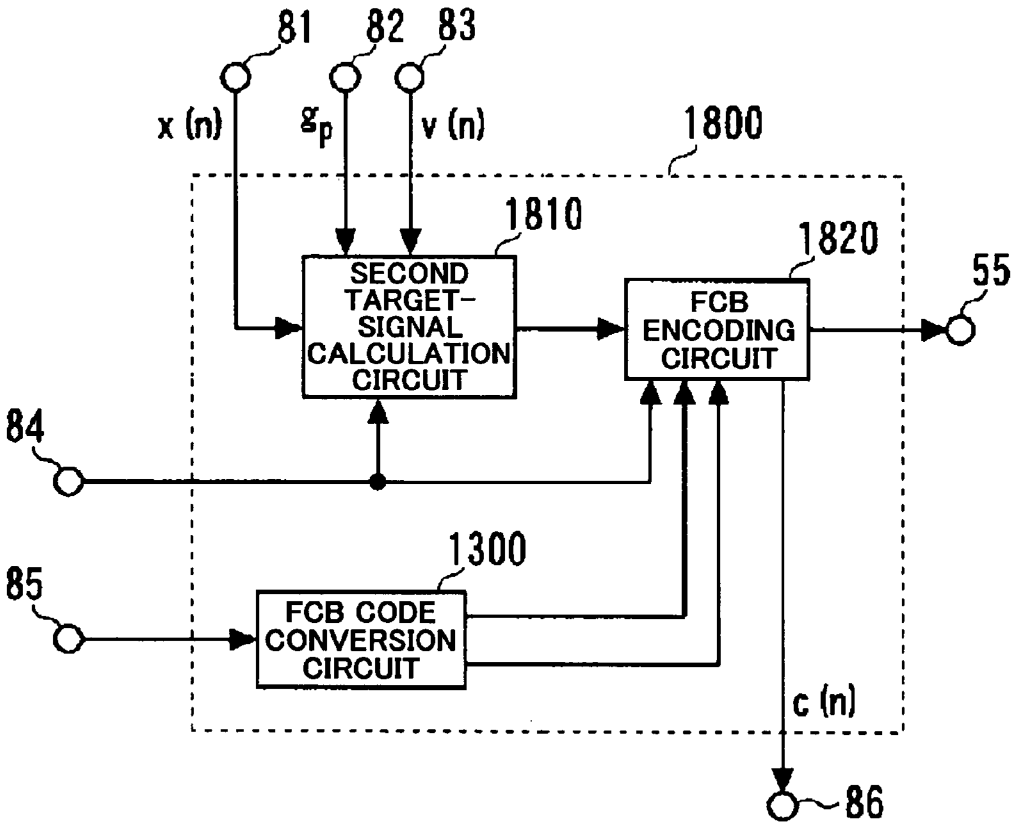
FIG. 7 is a block diagram of a FCB code generation circuit which is a part of the code-conversion apparatus in accordance with the first embodiment of the present invention.

FIG. 7 is a block diagram showing an example of a structure of the FCB code generation circuit 1800 in the first embodiment.

As illustrated in FIG. 7, the FCB code generation circuit 1800 is comprised of a second target-signal calculation circuit 1810, a FCB code conversion circuit 1300, and a FCB encoding circuit 1820.

The second target-signal calculation circuit 1810 receives a first target signal x(n) output from the weighting signal calculation circuit 1710 which is a part of the target-signal calculation circuit 1700, through an input terminal 81, receives an impulse response signal from the impulse response calculation circuit 1120 through an input terminal 84, and receives a second ACB signal v(n) and an optimal ACB gain $g_p$ from the ACB signal generation circuit 1720 through input terminals 83 and 82, respectively.

The second target-signal calculation circuit 1810 calculates a filtered second ACB signal y(n) (25) by carrying out convolution of the second ACB signal y(n) and the impulse response signal, $$y(n), n=0, L_{sfr}^{(B)}-1 \tag{25}$$

and generates a second target signal x'(n) by subtracting a signal obtained by multiplying the second ACB signal y(n) with the optimal ACB gain $g_p$, from the first target signal.

$$x'(n)=x(n)-g_p y(n) \tag{26}$$

$$y(n)=v(n)*h(n) \tag{27}$$

The second target-signal calculation circuit 1810 outputs the thus calculated second target signal x'(n) to the FCB encoding circuit 1820.

The FCB code conversion circuit 1300 changes a first FCB code received from the code-demultiplexing circuit 1010 through an input terminal 85, into a part of a second FCB code in accordance with a correspondence between a code in conformity to the first process and a code in conformity to the second process.

For instance, it is assumed that a FCB signal in conformity to the first process is comprised of four pulses P0, P1, P2 and P3, a possible location of each of the pulses is defined with the track 1, 2, 3 and 4 in Table 1 within 40-sample FCB signals (0, 1, 2, . . . , 39).

TABLE 1

| Track | Pulse | Locations |
|---|---|---|
| 1 | P0 | 0, 5, 10, 15, 20, 25, 30, 35 |
| 2 | P1 | 1, 6, 11, 16, 21, 26, 31, 36 |
| 3 | P2 | 2, 7, 12, 17, 22, 27, 32, 37 |
| 4 | P3 | 3, 8, 13, 18, 23, 28, 33, 38 |
| | | 4, 9, 14, 19, 24, 29, 34, 39 |

It is also assumed that a FCB signal in conformity to the second process is comprised of ten pulses P0, P1, P2, . . . , P9, a possible location of each of the pulses is defined with the track 1, 2, 3, 4 and 5 in Table 2.

TABLE 2

| Track | Pulse | Locations |
|---|---|---|
| 1 | P0, P5 | 0, 5, 10, 15, 20, 25, 30, 35 |
| 2 | P1, P6 | 1, 6, 11, 16, 21, 26, 31, 36 |
| 3 | P2, P7 | 2, 7, 12, 17, 22, 27, 32, 37 |
| 4 | P3, P8 | 3, 8, 13, 18, 23, 28, 33, 38 |
| 5 | P4, P9 | 4, 9, 14, 19, 24, 29, 34, 39 |

Among the ten pulses P0, P1, P2, . . . , P9 in a FCB signal in conformity to the second process, it is possible to correspond the pulses P0, P1 and P2 to the pulses P0, P1 and P2 in a FCB signal in conformity to the first process, and it is also possible to obtain a pulse location code and a pulse sign code of each of the three pulses P0, P1 and P2.

The FCB code conversion circuit 1300 outputs pulse location codes and pulse sign codes of the pulses P0, P1 and P2 to the FCB encoding circuit 1820 as a partial FCB code.

In contrast, if Table 1 is in conformity to the second process and Table 2 is in conformity to the first process, it would not be possible to correspond the pulses P0, P1, P2 and P3 in a FCB signal in conformity to the second process directly to any one of the ten pulses P0, P1, P2, . . . , P9 in a FCB signal in conformity to the first process. Thus, the partial FCB code is indeterminate. Accordingly, the FCB encoding circuit 1820 selects a location and a sign of each of the pulses P0, P1, P2 and P3.

The FCB encoding circuit 1820 receives a second target signal x'(n) from the second target-signal calculation circuit 1810, receives an impulse response signal from the impulse response calculation circuit 1120 through an input terminal 84, and receives a partial FCB code from the FCB code conversion circuit 1300.

The FCB encoding circuit 1820 selects such a pulse location and a pulse sign that a distance between a FCB signal (28) filtered by convolution of a FCB signal and an impulse response signal, and a second target signal x'(n) is minimized for pulses (pulses P3, P4, . . . , P9 in the above-mentioned case) except pulses (pulses P0, P1 and P2 in the above-mentioned case) a pulse location and a pulse sign of which can be determined by the partial FCB code.

$$z(n), n=0, \ldots, L_{sfr}^{(B)}-1 \tag{28}$$

This is equivalent to selection of such a pulse location and a pulse sign that an estimate Ak expressed with the equation (29) is maximized. A candidate of each of the pulse locations is identical with the location shown in Table 2 in accordance with the track to which each of the pulses belongs.

$$A_k = \frac{(C_k)^2}{E_{Dk}} = \frac{(d^t c_k)_2}{c_k^t \Phi c_k} \tag{29}$$

In the equation (29), the vector Ck indicates a k-th candidate of a FCB signal, and "d" and "Φ" are expressed as follows.

$$d=H^t x' \tag{30}$$

$$\Phi=H^t H \tag{31}$$

The vector x' indicates a second target signal, "H" indicates an inverse-triangle Toepliz matrix having impulse response signals h(n) as parts, "$H^t$" indicates a transposed matrix of the matrix H, "$ck^t$" indicates a transposed vector of the vector "ck", and "$d^t$" indicates a transposed vector of the vector "d".

A method of selecting a FCB signal, that is, a method of selecting a pulse location and a pulse sign of a FCB signal is detailed in the section 5.7 in the reference 3.

The FCB encoding circuit 1820 generates a FCB signal defined with a pulse location and a pulse sign determined with the partial FCB code and the selected pulse location and pulse sign, as a second FCB signal c(n).

Then, the FCB encoding circuit 1820 outputs a code decodable in accordance with the second process and corresponding to the second FCB signal, to the code-multiplexing circuit 1020 through an output terminal 55 as a second FCB code, and outputs the second FCB signal c(n) to a later-mentioned gain encoding circuit 1410 and the second excitation-signal calculation circuit 1610 through an output terminal 86.

In contrast, if Table 1 for the FCB code conversion circuit 1300 is in conformity to the second process and Table 2 is in conformity to the first process, it would not be possible to correspond the pulses P0, P1, P2 and P3 of a FCB signal in conformity to the second process directly to any one of the pulses P0, P1, P2, . . . , P9 of a FCB signal in conformity to the first process. Hence, the FCB code conversion circuit 1300 selects a location and a sign of all of the pulses P0, P1, P2 and P3.

Herein, expressing a pulse Pn (n=0, 1, 2, . . . , 9) in conformity to the first process as Pn(A), and a pulse Pn in conformity to the second process as Pn(B), candidates of pulses P0(A) to P3(A) are as follows.

Candidate of a pulse P0(A): a pulse P0(B) or a pulse P5(B)

Candidate of a pulse P1(A): a pulse P1(B) or a pulse P6(B)

Candidate of a pulse P2(A): a pulse P2(B) or a pulse P7(B)

Candidate of a pulse P3(A): pulses P3(B) and P8(B) or pulses P4(B) and P9(B)

The FCB encoding circuit 1820 selects a pulse location and a pulse sign that maximize an estimate Ak, for each of these pulse location candidates, and defines a FCB signal with the thus selected pulse location and pulse sign, as a second FCB signal c(n).

As a candidate of a pulse location, there may be used locations included in the track associated with each of the pulses shown in Table 1.

Figure 8:
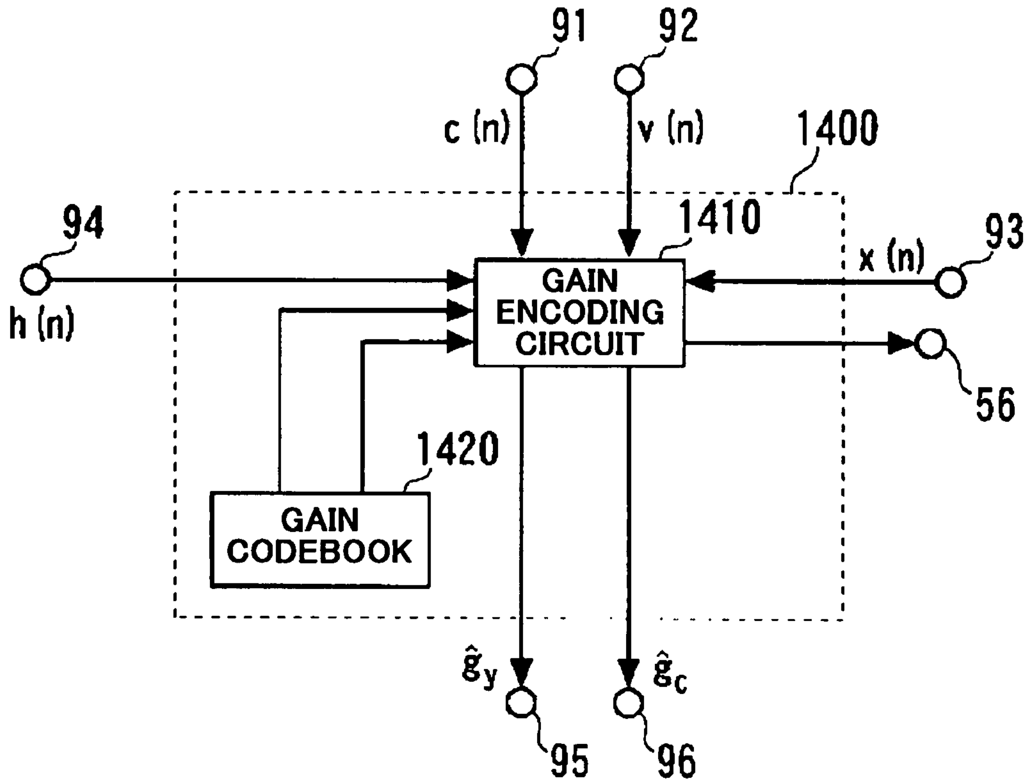
FIG. 8 is a block diagram of a gain code generation circuit which is a part of the code-conversion apparatus in accordance with the first embodiment of the present invention.

FIG. 8 is a block diagram showing an example of a structure of the gain code generation circuit 1400 in the first embodiment.

As illustrated in FIG. 8, the gain code generation circuit 1400 is comprised of a gain encoding circuit 1410 and a gain codebook 1420.

The gain encoding circuit 1410 receives a first target signal x(n) from the weighting signal calculation circuit 1710 which is a part of the target-signal calculation circuit 1700, through an input terminal 93, receives a second ACB signal v(n) from the ACB signal generation circuit 1720 through an input terminal 92, receives a second FCB signal c(n) from the FCB encoding circuit 1820 through an input terminal 91, and receives an impulse response signal h(n) from the impulse response calculation circuit 1120 through an input terminal 94.

The gain encoding circuit 1410 successively reads an ACB gain and a FCB gain out of the gain codebook 1420 storing therein a plurality of ACB gains and a plurality of FCB gains, successively calculates weighted reconstructed audio, based on the second ACB signal, the second FCB signal, the impulse response signal, the ACB gain and the FCB gain, successively calculates weighted square errors of the weighted reconstructed audio and the first target signals, and selects an ACB gain and a FCB gain which minimizes the weighted square error.

Herein, a weighted square error E is expressed with the following equation (32).

$$E = \sum_{n=0}^{L_{sfr}^{(B)}-1} (x(n) - \hat{g}_p \cdot z(n) - \hat{g}_c \cdot y(n))^2 \text{ wherein} \tag{32}$$

$$\hat{g}_p \text{ and} \tag{33}$$

$$\hat{g}_c \tag{34}$$

indicates an ACB gain and a FCB gain, respectively. The term "y(n)" indicates a filtered second ACB signal, and is obtained by convolution of a second ACB signal and an impulse responses signal. The term "z(n)" indicates a filtered second FCB signal, and is obtained by convolution of a second FCB signal and an impulse responses signal. The weighted reconstructed audio is expressed with the following equation (35).

$$\hat{s}(n)=\hat{g}_p \cdot z(n)+\hat{g}_c \cdot y(n) \tag{35}$$

Then, the gain encoding circuit 1410 outputs a code decodable in accordance with the second process and corresponding to the selected ACB gain and FCB gain, to the code-multiplexing circuit 1020 through an output terminal 56 as a second gain code, and further outputs the ACB gain and the FCB gain to the second excitation-signal calculation circuit 1610 through output terminals 95 and 96 as a second ACB gain and a second FCB gain, respectively.

The ACB and FCB gains are selected and encoded in accordance with a method of selecting and encoding ACB and FCB gains in the second process, through the use of a gain codebook in conformity to the second process. A method of selecting a gain is described in the section 5.8 in the reference 3, for instance.

The code-conversion apparatus 1000 in accordance with the above-mentioned first embodiment can be accomplished by means of a controller such as a digital signal processor.

Figure 9:
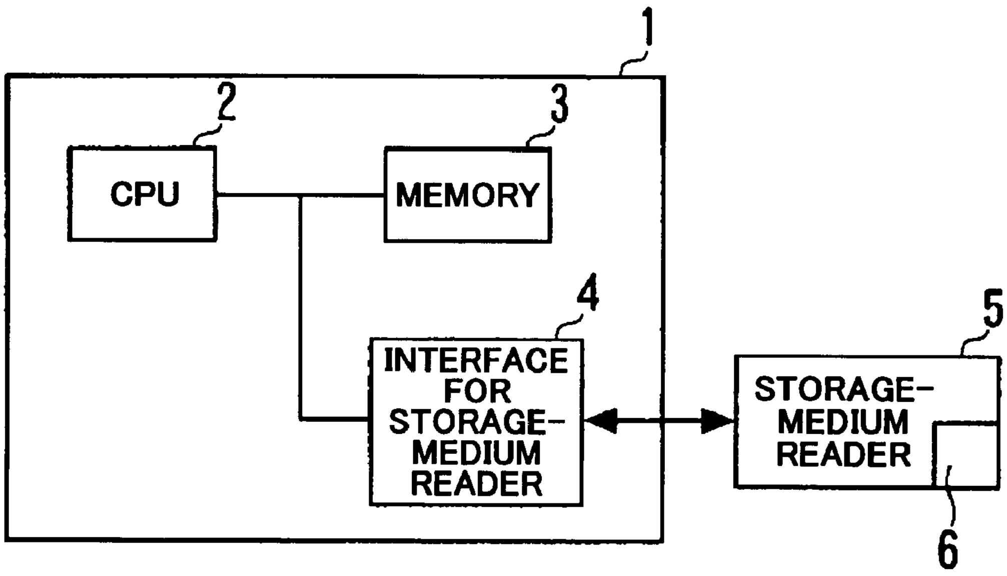
FIG. 9 is a block diagram of an apparatus for converting codes, in accordance with the second embodiment of the present invention.

FIG. 9 is a block diagram of the second embodiment of the present invention, that is, a computer for carrying out the code conversion which was carried out by the code-conversion apparatus 1000 in accordance with the above-mentioned first embodiment.

As illustrated in FIG. 9, a computer 1 is comprised of a central processing unit 2, a memory 3, and an interface 4 for a storage-medium reader. The interface 4 is electrically connected to a storage-medium reader 5 as an external device.

A storage medium 6 is set into the storage-medium reader 5. The storage medium 6 stores therein a program for operating the computer 1. The storage-medium reader 5 reads the program out of the storage medium 6.

The program read out by the storage-medium reader 5 is stored in the memory 3 through the interface 4. The central processing unit 2 reads the program out of the memory 3, and executes the program.

The memory 3 is comprised of a non-volatile semiconductor memory such as a mask ROM or a flash memory.

In the specification, the term "storage medium" indicates all mediums which can store data therein.

For instance, as the storage medium 6, there may be used, apart from a non-volatile memory, a disk-shaped storage medium such as CD-ROM (Compact Disk-ROM) or PD, a magnetic tape (MT), MO (Magneto Optical Disk), DVD (Digital Versatile Dish), DVD-ROM (DVD-Read Only Memory), DVD-RAM (DVD-Random Access Memory), a flexible disk, a memory chip such as RAM (Random Access Memory) or ROM (Read Only Memory), EPROM (Erasable Programmable Read Only Memory), EEPROM (Electrically Erasable Programmable Read Only Memory), Smart media (Registered Trade Mark), a flash memory, a rewritable card-type ROM such as a Compact flush (Registered Trade Mark) card, a hard disk, a portable HD, or any other suitable means for storing a program therein The storage medium 6 may be accomplished by programming necessary functions with a programming language readable by the computer 1, and recording the program into the storage medium 6 capable of storing the program therein.

A hard disc equipped in a server may be employed as the storage medium 6.

As an alternative, for instance, the program may be transferred to the computer 1 from a server (not illustrated) through a wire or in wireless.

When the computer 1 executing the program read out of the storage medium 6 carries out code conversion for converting a first code obtained by encoding audio by means of a first encoding/decoding apparatus, into a second code decodable in accordance with a second encoding/decoding apparatus, the storage medium 6 is designed to store a program for executing the following steps (a) to (e):

(a) a step of calculating a first linear prediction coefficient, based on a first code string;

(b) a step of obtaining excitation-signal information from a first code string;

(c) a step of obtaining an excitation signal from the excitation-signal information;

(d) a step of driving a filter having a first linear prediction coefficient, with the excitation-signal to thereby generate an audio signal; and (e) a step of obtaining fixed-codebook information in a second code string by minimizing a distance between a second audio signal generated based on information obtained from the second code string and a first audio signal, through the use of fixed-codebook information included in the excitation-signal information.

The computer 1 may be designed to execute the following step (e) in place of the above-mentioned step (e).

(e) a step of using fixed-codebook information included in the excitation-signal information, as a part of the fixed-codebook information in the second code string, and obtaining the fixed-codebook information in the second code string by minimizing a distance between a second audio signal generated, based on information obtained from the second code string, and a first audio signal.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-147485 filed on May 22, 2002 including specification, claims, drawings and summary is incorporated herein by reference in its entirety.

What is claimed is:

1. A code-conversion apparatus, comprising:

a digital signal processor, the digital signal processor comprising:

a code-demultiplexing module which demultiplexes multiplexed codes; and a code-multiplexing module which multiplexes codes, wherein code string data resulted from multiplexing codes obtained by encoding an audio signal in accordance with a first encoding process is demultiplexed into codes in said code-demultiplexing module, the thus demultiplexed codes are converted into codes which are in conformity to a second process different from said first process, the thus converted codes are transmitted to said code-multiplexing module, and the converted codes are multiplexed with one another in said code-multiplexing module to thereby generate code string data, characterized by an audio-decoding module which decodes excitation-signal information including an adaptive codebook code, a fixed codebook code and a gain code all of which are in conformity to said first process and which were demultiplexed in said code-demultiplexing module, and drives a synthesis filter having a first linear prediction coefficient decoded in accordance with said first process, with an excitation signal obtained from said excitation-signal information, based on a linear prediction coefficient code demultiplexed in said code-demultiplexing module, to thereby synthesize a decoded audio signal;

a fixed codebook code generation module which obtains at least a part of a fixed codebook code which is in conformity to said second process, from a fixed codebook code which is in conformity to said first process, obtains a fixed codebook signal through the use of said decoded audio signal, and generates a fixed codebook code which is in conformity to said second process by combining a fixed codebook code associated with said fixed codebook signal with the partial fixed codebook code obtained by changing said code;

a module which generates a first linear prediction coefficient decoded in accordance with said first process and a second linear prediction coefficient decoded in accordance with said second process based on said linear prediction coefficient code demultiplexed in said code-demultiplexing module;

an adaptive codebook code conversion module which generates an adaptive codebook code which is in conformity to said second process by changing an adaptive codebook code which is in conformity to said first process and which is input from said code-demultiplexing module in accordance with the correspondence between codes in conformity to said first process and codes in conformity to said second process and transmits adaptive codebook delay corresponding to an adaptive codebook code in conformity to said second process to a later-mentioned target signal calculation circuit as second adaptive codebook delay;

an impulse response calculation circuit which defines an auditory sense weighted synthesis filter through the use of said first and second linear prediction coefficients and outputs an impulse response signal of said auditory sense weighted synthesis filter; and a target signal calculation circuit which calculates a first target signal from said decoded audio signal and said first and second linear prediction coefficients, wherein said target signal calculation circuit further calculates a second adaptive codebook signal and an optimal adaptive codebook gain from:

said second adaptive codebook signal, a second excitation signal generated in the past in accordance with a second fixed codebook signal and said gain signal, said impulse response signal, said first target signal, and said second adaptive codebook delay, and outputs said first target signal, said optimal adaptive codebook gain and said second adaptive codebook signal, wherein said fixed codebook code generation circuit generates a fixed codebook code which is in conformity to said second process with respect to a pulse to which a correspondence between said first and second processes can be applied by changing said first fixed codebook code in accordance with said correspondence by selecting such a pulse location and a pulse sign such that a distance between a fixed codebook signal and a second target signal is minimized with respect to a pulse to which said correspondence cannot be applied, wherein said fixed codebook signal being filtered through convolution operation of said fixed codebook signal and said impulse response signal, wherein said second target signal resulting from subtracting a signal obtained by multiplying said optimal adaptive codebook gain with a second adaptive codebook signal, wherein said second adaptive codebook signal filtered by a convolution of said second adaptive codebook signal and said impulse response signal from said first target signal, wherein said first target signal defines a fixed codebook signal from a pulse location and a pulse sign resulting from changing said first fixed codebook code and a pulse location and a pulse sign resulted from said selection as a second fixed codebook signal and outputs a code decodable in accordance with said second process and corresponding to said second fixed codebook signal as a second fixed codebook code.

2. The code-conversion apparatus as set forth in claim 1, wherein said fixed-codebook signal is expressed with a multi-pulse signal defined with a pulse location and a pulse sign.

3. A code-conversion apparatus, comprising:

a digital signal processor, the digital signal processor comprising:

a code-demultiplexing circuit which demultiplexes multiplexed codes; and a code-multiplexing circuit which multiplexes codes, wherein code string data resulted from multiplexing codes obtained by encoding an audio signal in accordance with a first encoding process is demultiplexed into codes in said code-demultiplexing circuit, the demultiplexed codes are converted into codes which are in conformity to a second process different from said first process, the converted codes are transmitted to said code-multiplexing circuit and the converted codes are multiplexed with one another in said code-multiplexing circuit to thereby generate code string data, characterized by:

a linear prediction coefficient generation circuit;

an audio-decoding circuit;

an impulse response calculation circuit; and a fixed codebook code generation circuit, wherein said linear prediction coefficient generation circuit generates a first linear prediction coefficient decoded in accordance with said first process and a second linear prediction coefficient decoded in accordance with said second process from said linear prediction coefficient code demultiplexed in said code-demultiplexing circuit, said audio-decoding circuit decodes excitation-signal information including an adaptive codebook code demultiplexed in said code-demultiplexing circuit, and drives a synthesis filter having a first linear prediction coefficient, with an excitation signal obtained from said excitation-signal information to thereby synthesize and output a decoded audio signal, said impulse response calculation circuit defines an auditory sense weighted synthesis filter through the use of said first an second linear prediction coefficients and outputs an impulse response signal of said auditory sense weighted synthesis filter, said fixed codebook code generation circuit generates a fixed codebook code which is in conformity to said second process with respect to a pulse to which a correspondence between said first and second processes can be applied by changing said first fixed codebook code in accordance with said correspondence by selecting such a pulse location and a pulse sign such that a distance between a fixed codebook signal and a second target signal is minimized with respect to a pulse to which said correspondence cannot be applied, wherein said fixed codebook signal being filtered through a convolution operation of said fixed codebook signal and said impulse response signal, wherein said second target signal results from subtracting a signal obtained by multiplying said optimal adaptive codebook gain with an adaptive codebook signal filtered by a convolution of said adaptive codebook signal and said impulse response signal from said first target signal, wherein said first target signal defines a fixed codebook signal defined by a pulse location and a pulse sign resulted from changing said first fixed codebook code and a pulse location and a pulse sign resulted from said selection as a second fixed codebook signal and outputs a code decodable in accordance with said second process and corresponding to said second fixed codebook signal as a second fixed codebook code.

4. The code-conversion apparatus as set forth in claim 3, further comprising an ACB code conversion circuit which changes a first ACB code received from said code-demultiplexing circuit into a second ACB code in accordance with a correspondence between codes in conformity to said first process and codes in conformity to said second process and outputs ACB delay associated with said second ACB code as second ACB delay.

5. The code-conversion apparatus as set forth in claim 4, further comprising:

a target signal calculation signal which calculates a first target signal from said decoded audio signal and said first and second linear prediction coefficients and calculates a second ACB signal and an optimal ACB gain, based on a second excitation signal, said impulse response signal, said first target signal and said second ACB delay;

a gain code generation circuit which selects an ACB gain and a FCB gain which minimize a weighted square error of said first target signal and reconstructed audio generates a code decodable in accordance with said second process and corresponding to the thus selected ACB gain and FCB gain as a second gain code, and outputs the selected ACB gain and FCB gain as a second ACB gain and a second FCB gain respectively;

a second excitation-signal calculation circuit which generates a second excitation signal by adding a signal resulted from multiplying said second ACB signal with said second ACB gain to a signal resulted from multiplying said second FCB signal with said second FCB gain; and a second excitation-signal storage circuit which stores said second excitation signal therein and outputs a second excitation signal stored therein.

6. A code-conversion apparatus, comprising:

a microprocessor programmed to provide:

a code-demultiplexing module which demultiplexes multiplexed codes; and a code-multiplexing module which multiplexes codes, wherein code string data resulted from multiplexing codes obtained by encoding an audio signal in accordance with a first encoding process is demultiplexed into codes in said code-demultiplexing module, the thus demultiplexed codes are converted into codes which are in conformity to a second process different from said first process, the thus converted codes are transmitted to said code-multiplexing module, and the converted codes are multiplexed with one another in said code-multiplexing module to thereby generate code string data, characterized by an audio-decoding module which decodes excitation-signal information including an adaptive codebook code, a fixed codebook code and a gain code all of which are in conformity to said first process and which were demultiplexed in said code-demultiplexing module, and drives a synthesis filter having a first linear prediction coefficient decoded in accordance with said first process, with an excitation signal obtained from said excitation-signal information, based on a linear prediction coefficient code demultiplexed in said code-demultiplexing module, to thereby synthesize a decoded audio signal;

a fixed codebook code generation module which obtains at least a part of a fixed codebook code which is in conformity to said second process, from a fixed codebook code which is in conformity to said first process, obtains a fixed codebook signal through the use of said decoded audio signal, and generates a fixed codebook code which is in conformity to said second process by combining a fixed codebook code associated with said fixed codebook signal with the partial fixed codebook code obtained by changing said code;

a module which generates a first linear prediction coefficient decoded in accordance with said first process and a second linear prediction coefficient decoded in accordance with said second process based on said linear prediction coefficient code demultiplexed in said code-demultiplexing module;

an adaptive codebook code conversion module which generates an adaptive codebook code which is in conformity to said second process by changing an adaptive codebook code which is in conformity to said first process and which is input from said code-demultiplexing module in accordance with the correspondence between codes in conformity to said first process and codes in conformity to said second process and transmits adaptive codebook delay corresponding to an adaptive codebook code in conformity to said second process to a later-mentioned target signal calculation module as second adaptive codebook delay;

an impulse response calculation module which defines an auditory sense weighted synthesis filter through the use of said first and second linear prediction coefficients and outputs an impulse response signal of said auditory sense weighted synthesis filter; and a target signal calculation module which calculates a first target signal from said decoded audio signal and said first and second linear prediction coefficients, wherein said target signal calculation module further calculates a second adaptive codebook signal and an optimal adaptive codebook gain from:

said second adaptive codebook signal, a second excitation signal generated in the past in accordance with a second fixed codebook signal and said gain signal, said impulse response signal, said first target signal, and said second adaptive codebook delay, and outputs said first target signal, said optimal adaptive codebook gain and said second adaptive codebook signal, wherein said fixed codebook code generation module generates a fixed codebook code which is in conformity to said second process with respect to a pulse to which a correspondence between said first and second processes can be applied by changing said first fixed codebook code in accordance with said correspondence by selecting such a pulse location and a pulse sign that a distance between a fixed codebook signal and a second target signal is minimized with respect to a pulse to which said correspondence cannot be applied, wherein said fixed codebook signal being filtered through convolution operation of said fixed codebook signal and said impulse response signal, wherein said second target signal resulting from subtracting a signal obtained by multiplying said optimal adaptive codebook gain with a second adaptive codebook signal, wherein said second adaptive codebook signal filtered by a convolution of said second adaptive codebook signal and said impulse response signal from said first target signal, wherein said first target signal defines a fixed codebook signal from a pulse location and a pulse sign resulting from changing said first fixed codebook code and a pulse location and a pulse sign resulted from said selection as a second fixed codebook signal and outputs a code decodable in accordance with said second process and corresponding to said second fixed codebook signal as a second fixed codebook code.

7. The code-conversion apparatus as set forth in claim 6, wherein said fixed-codebook signal is expressed with a multi-pulse signal defined with a pulse location and a pulse sign.

8. A code-conversion apparatus, comprising:

a microprocessor programmed to provide:

a code-demultiplexing module which demultiplexes multiplexed codes; and a code-multiplexing module which multiplexes codes, wherein code string data resulted from multiplexing codes obtained by encoding an audio signal in accordance with a first encoding process is demultiplexed into codes in said code-demultiplexing module, the demultiplexed codes are converted into codes which are in conformity to a second process different from said first process, the converted codes are transmitted to said code-multiplexing module and the converted codes are multiplexed with one another in said code-multiplexing module to thereby generate code string data, characterized by:

a linear prediction coefficient generation module;

an audio-decoding module;

an impulse response calculation module; and a fixed codebook code generation module, wherein said linear prediction coefficient generation module generates a first linear prediction coefficient decoded in accordance with said first process and a second linear prediction coefficient decoded in accordance with said second process from said linear prediction coefficient code demultiplexed in said code-demultiplexing module, said audio-decoding module decodes excitation-signal information including an adaptive codebook code demultiplexed in said code-demultiplexing module, and drives a synthesis filter having a first linear prediction coefficient, with an excitation signal obtained from said excitation-signal information to thereby synthesize and output a decoded audio signal, said impulse response calculation module defines an auditory sense weighted synthesis filter through the use of said first an second linear prediction coefficients and outputs an impulse response signal of said auditory sense weighted synthesis filter, said fixed codebook code generation module generates a fixed codebook code which is in conformity to said second process with respect to a pulse to which a correspondence between said first and second processes can be applied by changing said first fixed codebook code in accordance with said correspondence by selecting such a pulse location and a pulse sign such that a distance between a fixed codebook signal and a second target signal is minimized with respect to a pulse to which said correspondence cannot be applied, wherein said fixed codebook signal being filtered through a convolution operation of said fixed codebook signal and said impulse response signal, wherein said second target signal results from subtracting a signal obtained by multiplying said optimal adaptive codebook gain with an adaptive codebook signal filtered by a convolution of said adaptive codebook signal and said impulse response signal from said first target signal, wherein said first target signal defines a fixed codebook signal defined by a pulse location and a pulse sign resulted from changing said first fixed codebook code and a pulse location and a pulse sign resulted from said selection as a second fixed codebook signal and outputs a code decodable in accordance with said second process and corresponding to said second fixed codebook signal as a second fixed codebook code.

9. The code-conversion apparatus as set forth in claim 8, further comprising an ACB code conversion module which changes a first ACB code received from said code-demultiplexing module into a second ACB code in accordance with a correspondence between codes in conformity to said first process and codes in conformity to said second process and outputs ACB delay associated with said second ACB code as second ACB delay.

10. The code-conversion apparatus as set forth in claim 9, further comprising:

a target signal calculation signal which calculates a first target signal from said decoded audio signal and said first and second linear prediction coefficients and calculates a second ACB signal and an optimal ACB gain, based on a second excitation signal, said impulse response signal, said first target signal and said second ACB delay;

a gain code generation module which selects an ACB gain and a FCB gain which minimize a weighted square error of said first target signal and reconstructed audio generates a code decodable in accordance with said second process and corresponding to the thus selected ACB gain and FCB gain as a second gain code, and outputs the selected ACB gain and FCB gain as a second ACB gain and a second FCB gain respectively;

a second excitation-signal calculation module which generates a second excitation signal by adding a signal resulted from multiplying said second ACB signal with said second ACB gain to a signal resulted from multiplying said second FCB signal with said second FCB gain; and a second excitation-signal storage module which stores said second excitation signal therein and outputs a second excitation signal stored therein.

* * * * *